(12) United States Patent
Bae et al.

(10) Patent No.: US 11,694,946 B2
(45) Date of Patent: Jul. 4, 2023

(54) SEMICONDUCTOR DEVICES HAVING A PLURALITY OF OFFSETS IN LEADS SUPPORTING STACKED COMPONENTS AND METHODS OF MANUFACTURING THEREOF

(71) Applicant: Amkor Technology Singapore Holding Pte. Ltd., Valley Point (SG)

(72) Inventors: Jae Min Bae, Seoul (KR); Hyung Jun Cho, Incheon (KR); Seung Woo Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 17/328,861

(22) Filed: May 24, 2021

(65) Prior Publication Data
US 2022/0375834 A1    Nov. 24, 2022

(51) Int. Cl.
*H01L 23/495* (2006.01)
*H01L 21/56* (2006.01)
(Continued)

(52) U.S. Cl.
CPC ........ *H01L 23/49555* (2013.01); *H01L 21/56* (2013.01); *H01L 23/3107* (2013.01); *H01L 23/4951* (2013.01); *H01L 23/4952* (2013.01); *H01L 23/49524* (2013.01); *H01L 23/49541* (2013.01); *H01L 23/49551* (2013.01); *H01L 23/49575* (2013.01); *H01L 24/14* (2013.01);
(Continued)

(58) Field of Classification Search
CPC ............... H01L 25/0657; H01L 25/072; H01L 23/49555; H01L 23/3107; H01L 23/495524; H01L 23/49575; H01L 23/4951; H01L 23/49541; H01L 23/4592; H01L 24/32; H01L 24/29; H01L 24/83; H01L 24/81; H01L 21/56; H01L 2924/181; H01L 24/14; H01L 24/17
See application file for complete search history.

(56) References Cited

U.S. PATENT DOCUMENTS 5,917,242 A * 6/1999 Ball ....................... H01L 24/91
257/784
6,080,264 A * 6/2000 Ball ................... H01L 23/49524
29/841

(Continued)

*Primary Examiner* — Alonzo Chambliss
(74) *Attorney, Agent, or Firm* — Kevin B Jackson

(57) ABSTRACT

In one example, a semiconductor device includes a substrate having leads that include lead terminals, lead steps, and lead offsets extending between the lead steps so that at least some lead steps reside on different planes. A first electronic component is coupled to a first lead step side and includes a first electronic component first side, and a first electronic component second side opposite to the first electronic component first side. A second electronic component is coupled to a second lead step side, and includes a second electronic component first side, and a second electronic component second side opposite to the second electronic component first side. An encapsulant encapsulates the first electronic component, the second electronic component, and portions of the substrate. The lead terminals are exposed from a first side of the encapsulant. Other examples and related methods are also disclosed herein.

27 Claims, 19 Drawing Sheets

(51) Int. Cl.
  *H01L 23/31* (2006.01)
  *H01L 23/00* (2006.01)
  *H01L 25/07* (2006.01)
  *H01L 25/065* (2023.01)

(52) U.S. Cl.
  CPC .............. *H01L 24/17* (2013.01); *H01L 24/29* (2013.01); *H01L 24/32* (2013.01); *H01L 24/81* (2013.01); *H01L 24/83* (2013.01); *H01L 25/0657* (2013.01); *H01L 25/072* (2013.01)

(56) References Cited

U.S. PATENT DOCUMENTS

| | | | | |
|---|---|---|---|---|
| 6,087,718 | A * | 7/2000 | Cho | H01L 23/4951 257/692 |
| 6,483,181 | B2 * | 11/2002 | Chang | H01L 23/49575 438/109 |
| 6,744,121 | B2 * | 6/2004 | Chang | H01L 23/4951 257/668 |
| 7,919,360 | B1 * | 4/2011 | Camacho | H01L 23/49575 257/676 |
| 8,072,050 | B1 * | 12/2011 | Karim | H01L 23/49589 438/111 |
| 2008/0036051 | A1 * | 2/2008 | Espiritu | H01L 23/3135 257/E23.126 |

* cited by examiner

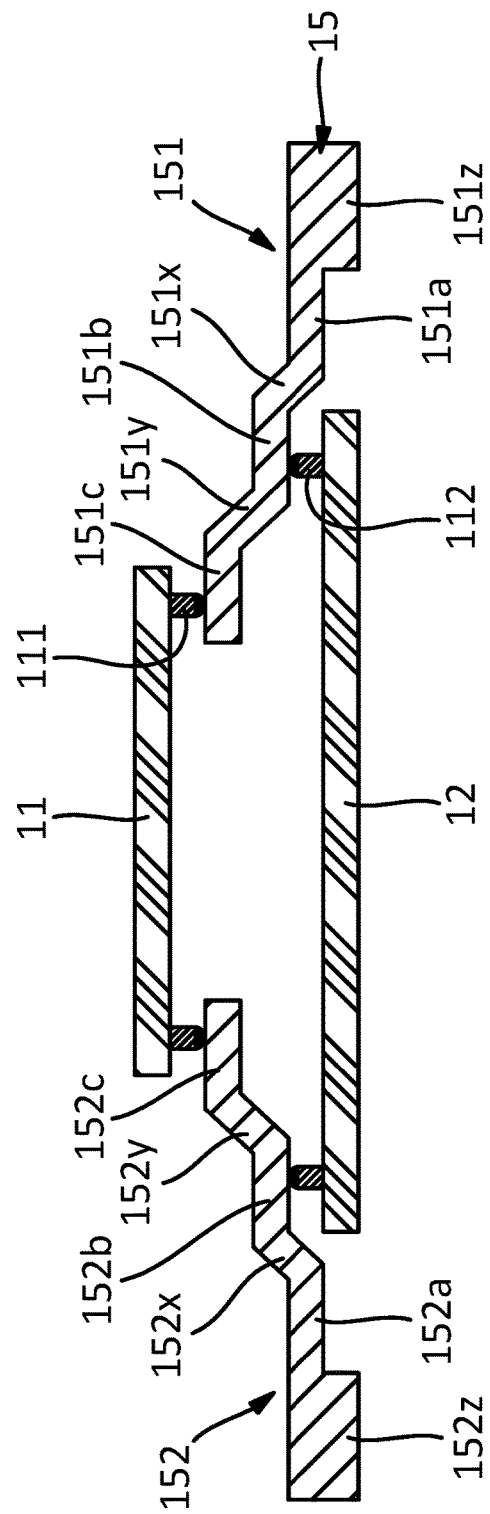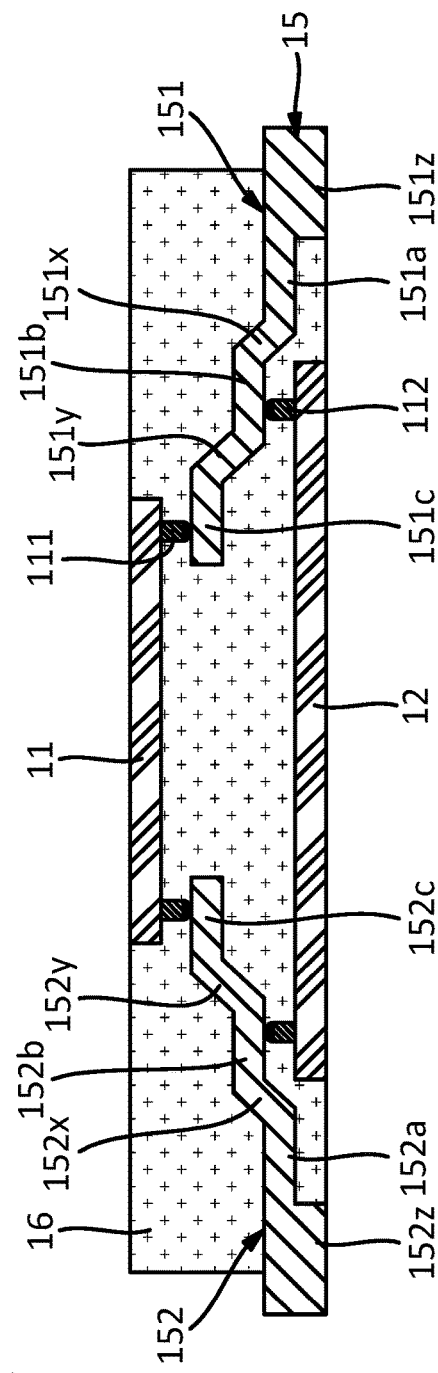

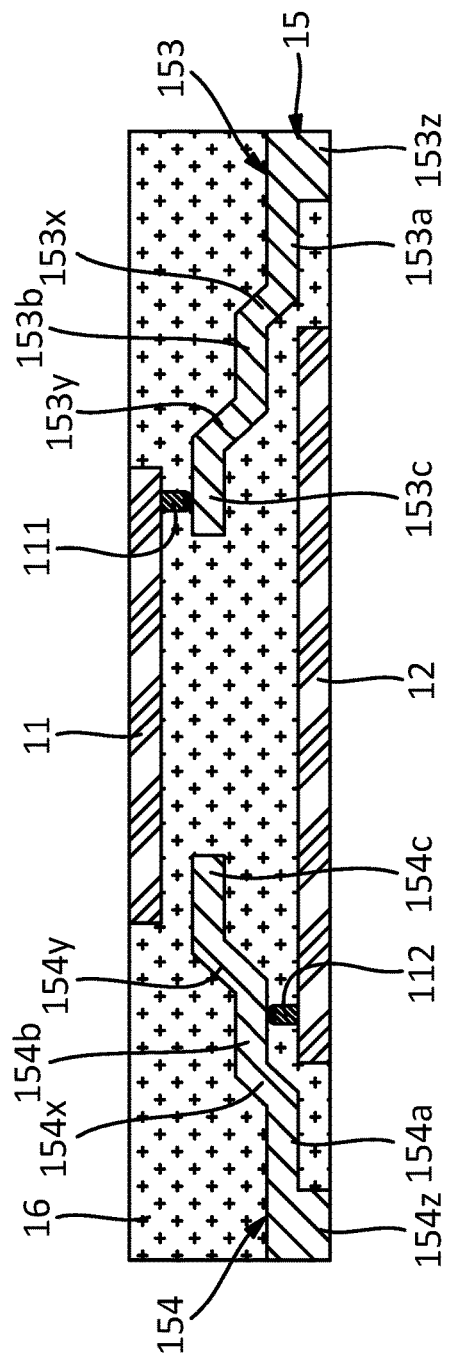
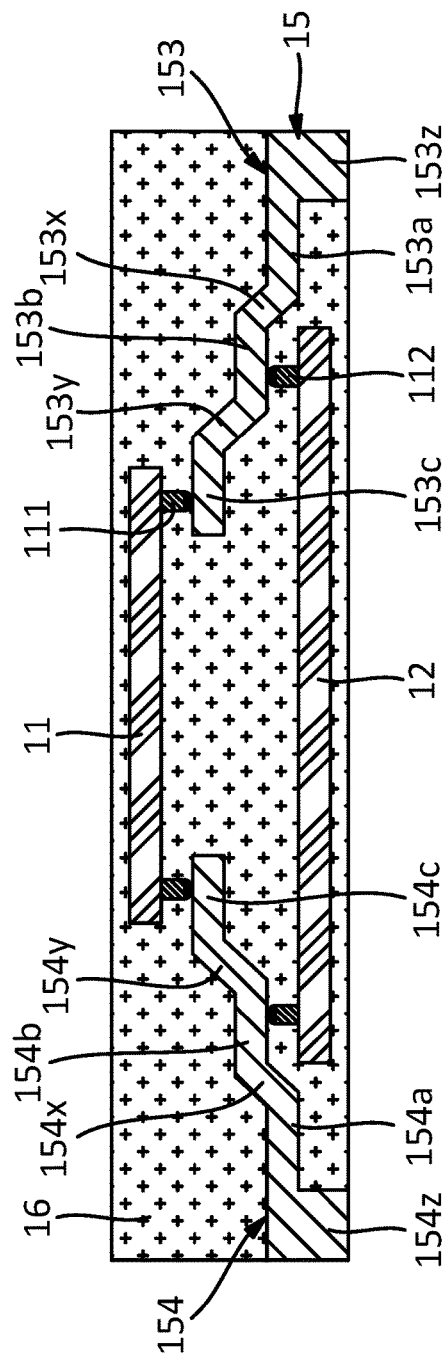
FIG.3A
FIG.3B

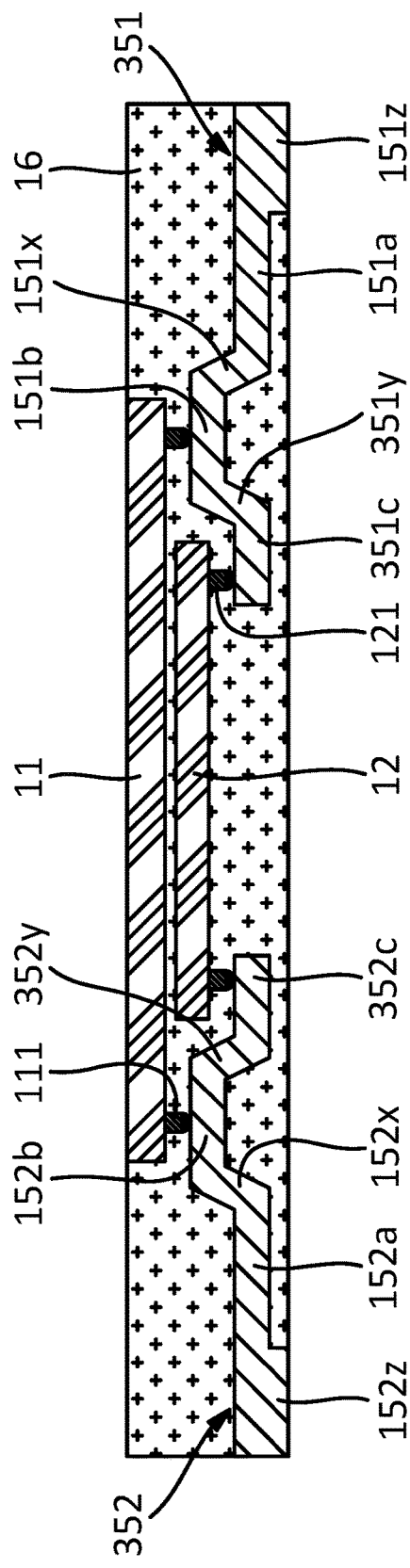
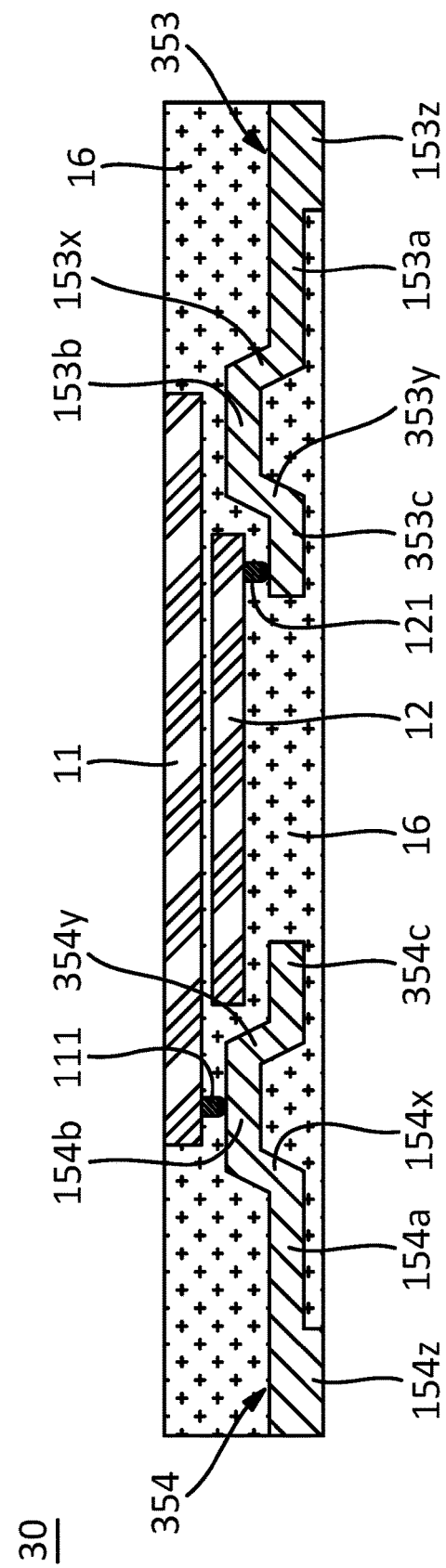
FIG.5G
FIG.5H

SEMICONDUCTOR DEVICES HAVING A PLURALITY OF OFFSETS IN LEADS SUPPORTING STACKED COMPONENTS AND METHODS OF MANUFACTURING THEREOF

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, and 2E show cross-sectional views of an example method for manufacturing an example semiconductor device.

FIGS. 3A, 3B, and 3C show cross-sectional views of an example semiconductor device.

FIGS. 5G and 5H show cross-sectional views of an example semiconductor device along reference line A and reference line B respectively of FIG. 5D.

Figure 1A:
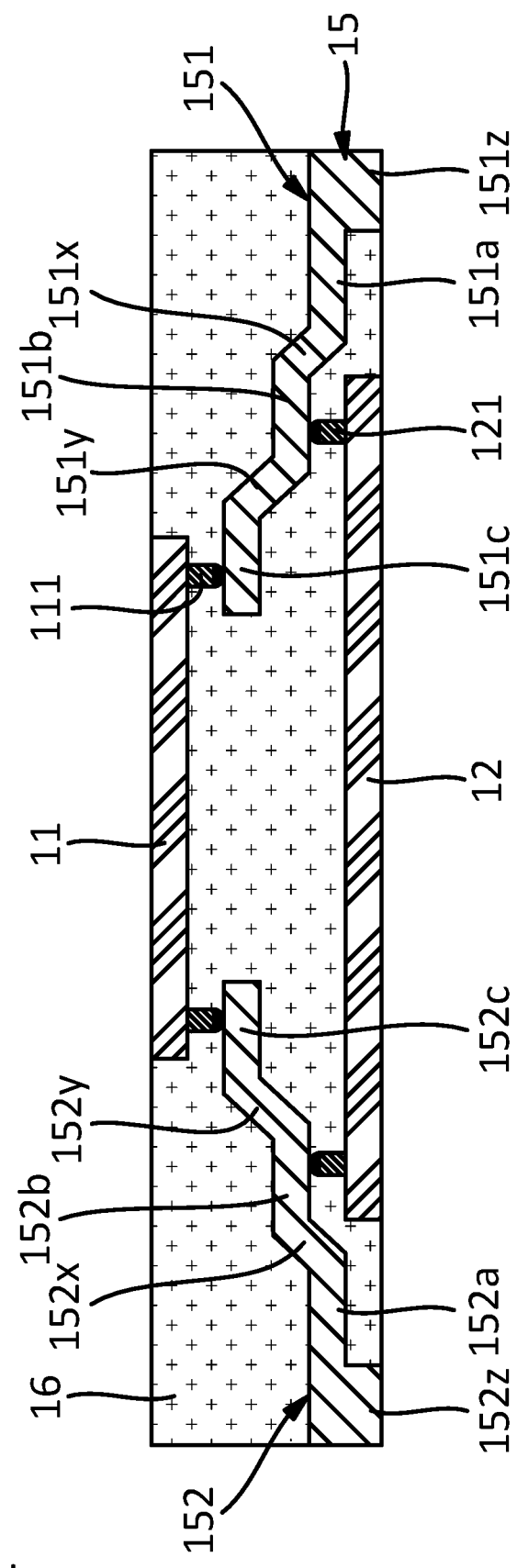
FIG. 1A shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

In an example, a semiconductor device includes a substrate having leads that include lead terminals, lead steps, and lead offsets extending between the lead steps so that at least some lead steps reside on different planes. A first electronic component is coupled to a first lead step side and includes a first electronic component first side, and a first electronic component second side opposite to the first electronic component first side. A second electronic component is coupled to a second lead step side, and includes a second electronic component first side, and a second electronic component second side opposite to the second electronic component first side. An encapsulant encapsulates the first electronic component, the second electronic component, and portions of the substrate. The lead terminals are exposed from a first side of the encapsulant.

In an example, a semiconductor device includes a substrate having a first lead and a second lead. The first lead includes a first lead terminal, a first lead step coupled to the first lead terminal and residing on a first plane, a first lead offset coupled to the first lead step, a second lead step coupled to the first lead offset and residing on a second plane that is different than the first plane, a second lead offset coupled to the second lead step, and a third lead step coupled to the second lead offset and residing on a third plane that is different than the second plane. The second lead includes a second lead terminal, a fourth lead step coupled to the second lead terminal and residing on a fourth plane, a third lead offset coupled to the fourth lead step, a fifth lead step coupled to the third lead offset and residing on a fifth plane that is different than the fourth plane, a fourth lead offset coupled to the fifth lead step, and a sixth lead step coupled to the fourth lead offset and residing on a sixth plane that is different than the fifth plane. A first electronic component is coupled to the first lead. A second electronic component is coupled to the second lead. An encapsulant encapsulates the first electronic component, the second electronic component, and portions of the substrate. The first lead terminal and the second lead terminal are exposed from a first side of the encapsulant.

In an example, a method of manufacturing a semiconductor device includes providing a substrate with leads. The leads include lead terminals, lead steps, and lead offsets extending between the lead steps so that at least some lead steps reside on different planes. The method includes coupling a first electronic component to a first lead step side. The first electronic component includes a first electronic component first side, and a first electronic component second side opposite to the first electronic component first side. The method includes coupling a second electronic component to a second lead step side. The second electronic component includes a second electronic component first side, and a second electronic component second side opposite to the second electronic component first side. The method includes providing an encapsulant encapsulating the first electronic component, the second electronic component, and portions of the substrate, wherein the lead terminals are exposed from a first side of the encapsulant.

Other examples are included in the present disclosure. Such examples may be found in the figures, in the claims, and/or in the description of the present disclosure.

Figure 1C:
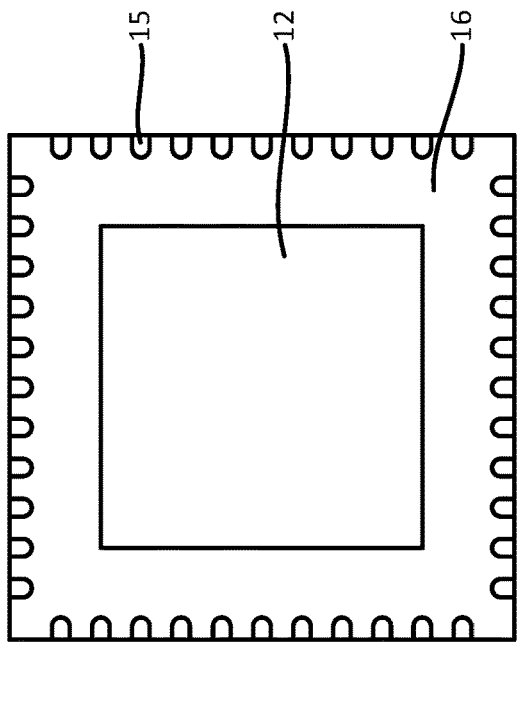
FIG. 1C shows a bottom view of an example semiconductor device.
Figure 1B:
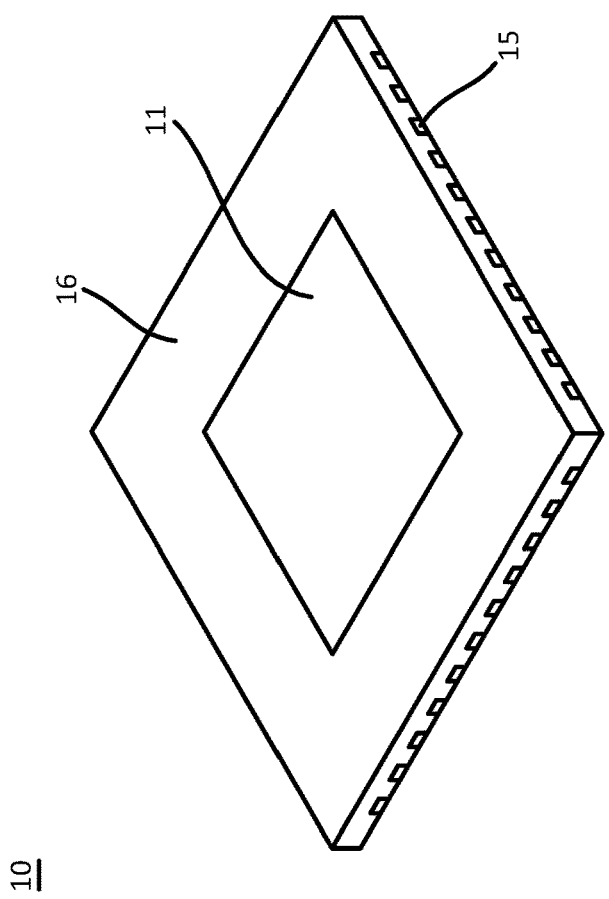
FIG. 1B shows a perspective view of an example semiconductor device.
Figure 1D:
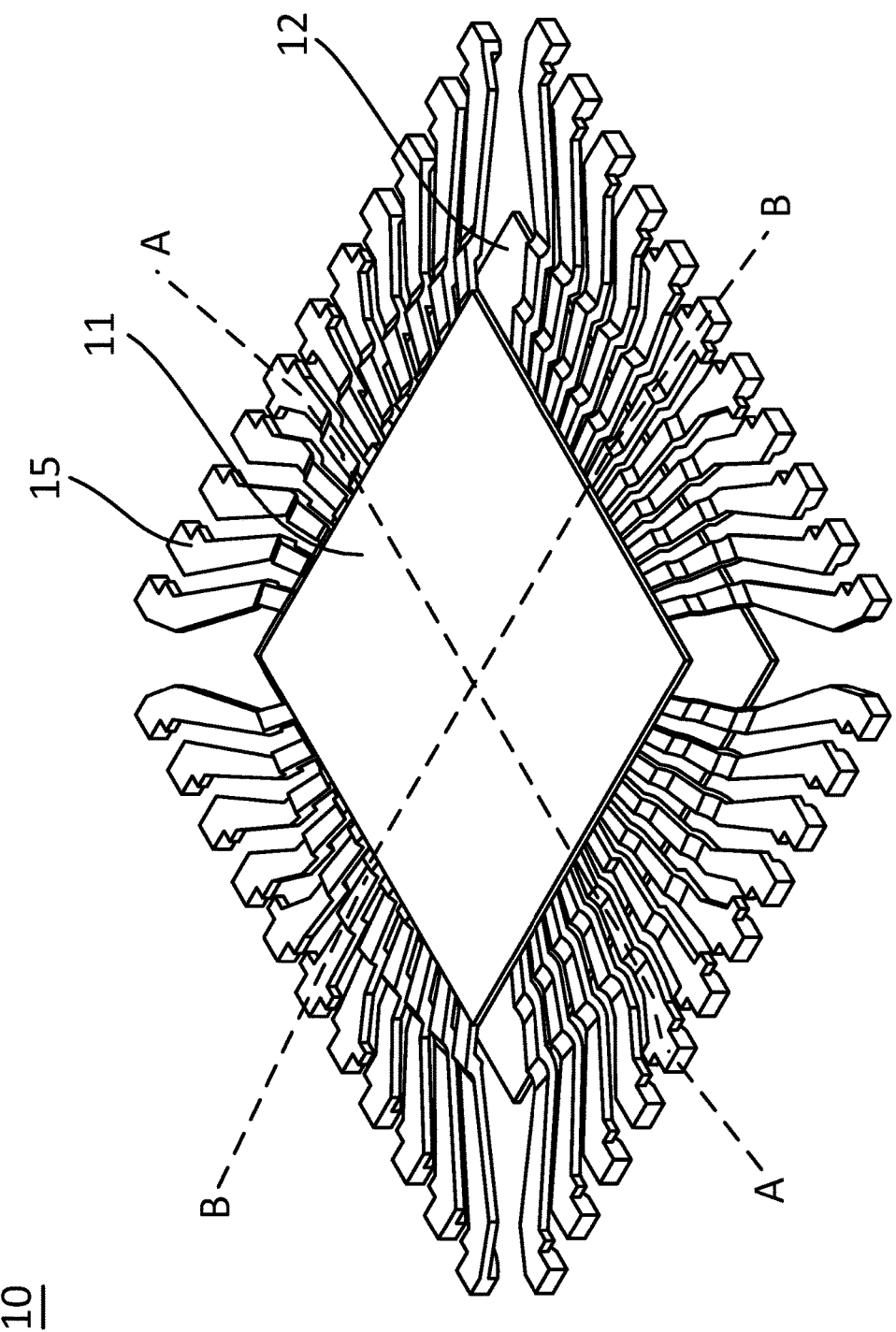
FIG. 1D shows a transparent perspective transparent view of an example semiconductor device.

FIG. 1A shows a cross-sectional view of an example semiconductor device 10. FIG. 1B shows a perspective view of semiconductor device 10. FIG. 1C shows a bottom view of semiconductor device 10. FIG. 1D shows a perspective transparent view of semiconductor device 10 at a later stage of manufacturing. In the example shown in FIGS. 1A to 1D, semiconductor device 10 can comprise electronic components 11 and 12, substrate 15, and encapsulant 16.

Electronic components 11 and 12 can comprise component interconnects 111 and 121. In some examples, substrate 15 can comprise or be referred to as a leadframe. In the example shown in FIG. 1A, electronic components 11 and 12 can be coupled to top and bottom portions of substrate 15.

Substrate 15, encapsulant 16, and component interconnects 111 and 121 can protect the electronic components 11 and 12 from an external factor and/or environmental exposure. Substrate 15 and component interconnects 111 and 121 can provide electrical coupling between an external component and electronic components 11 and 12.

FIGS. 2A, 2B, 2C, 2D, and 2E show cross-sectional views of example method for manufacturing an example semiconductor device. FIGS. 2A to 2E are cross-sectional views taken along the line A-A of FIG. 1D.

Figure 2A:
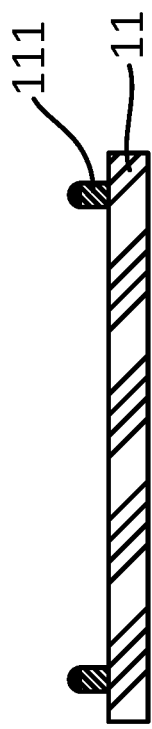

FIG. 2A shows a cross section view of electronic device 10 at an early stage of manufacture. In the example shown in FIG. 2A, electronic component 11 can be provided with component interconnects 111. Electronic component 11 can be coupled to substrate 15 through component interconnects 111. In the example shown in FIG. 2A, electronic device 10 can comprise or be referred to as a semiconductor component, a semiconductor die, a semiconductor chip or a semiconductor package. In some examples, electronic component 11 can comprise at least one of an application specific integrated circuit, a logic die, a micro controller unit, a memory, a digital signal processor, a network processor, a power management unit, an audio processor, an RF circuit, a sensor, or a wireless baseband system on-chip processor. In some examples, the body of electronic component 11 can have a thickness of about 80 μm to about 250 μm.

In some examples, component interconnects 111 can be located or provided at a first side of electronic component 11. In some examples, the first side of electronic component 11 can be referred to as a front side or an active side of electronic component 11 where device structures can be located. Component interconnects 111 can be input, output, signal, or power terminals of electronic component 11. Component interconnects 111 can be coupled to substrate 15. In some examples, component interconnects 111 can comprise or be referred to as die pads or bond pads. For example, component interconnects 111 can comprise electrically conductive materials, such as metal materials, aluminum, copper, aluminum alloys, or copper alloys. In some examples component interconnects 111 can comprise conductive ball/bump such as solder-ball/bump, conductive pillar such as Cu-pillar, or conductive post such as Cu-pillar with solder-tip. In some examples component interconnects 111 can have a width of about 40 μm to about 160 μm, or a thickness of about 50 μm to about 90 μm.

Figure 2B:
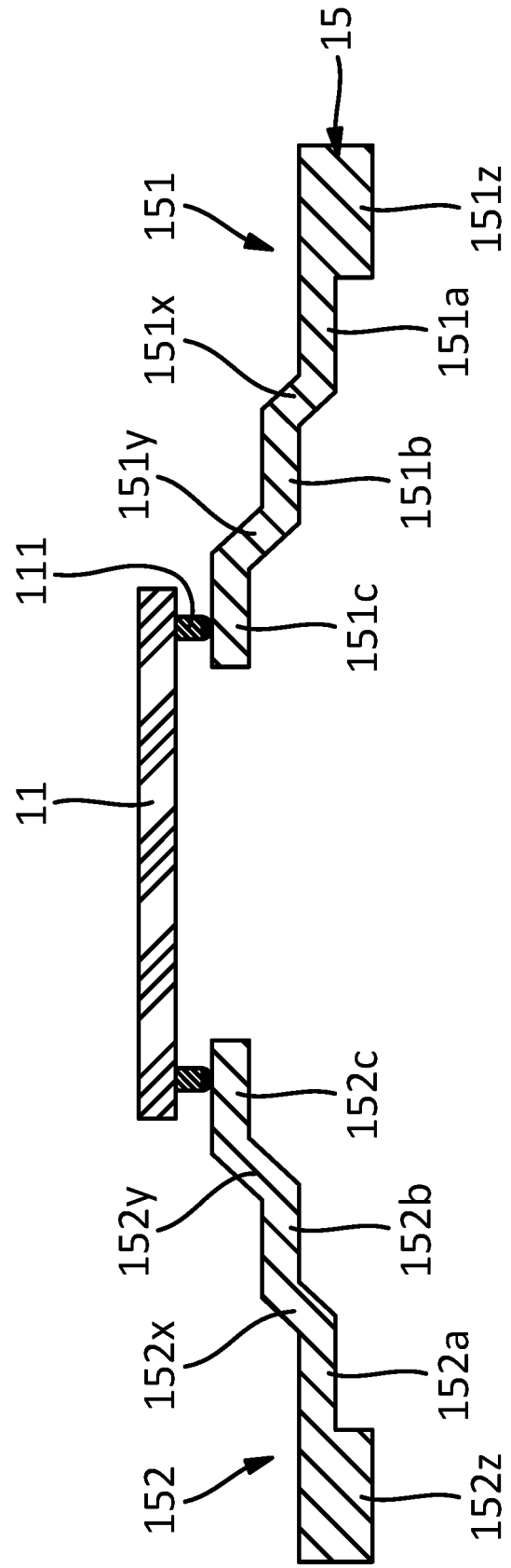

FIG. 2B shows a cross-sectional view of semiconductor device 10 at a later stage of manufacture. In the example shown in FIG. 2B, electronic component 11 can be coupled to substrate 15. In some examples, coupling of electronic component 11 with substrate 15 can be achieved by a reflow process or a laser-assisted bonding process. In some examples, substrate 15 can comprise or be referred to as a leadframe.

Substrate 15 can comprise leads 151 and 152 spaced apart from each other. In some examples, leads 151 and 152 can be referred to as fingers. In some examples, substrate 15 can have a thickness of about 100 μm to about 250 μm.

Lead 151 can comprise lead steps 151a, 151b, and 151c, lead offsets 151x and 151y, and lead terminal 151z. Lead steps 151a, 151b, and 151c, lead offsets 151x and 151y, and lead terminal 151z can be integral with each other as part of a same or continuous piece. In some examples, lead steps 151a, 151b, 151c, lead offsets 151x, 151y, or lead terminal 151z, can be defined by stamping, bending, or etching.

Lead step 151a can extend substantially horizontal, or substantially parallel to the first side of electronic component 11. The inner end of lead step 151a can face towards electronic component 11 and the outer end can face away from electronic component 11. Lead step 151a can be coupled by a tie-bar to neighboring lead steps 151a. Lead step 151a can be an example of a lead step residing on a first plane, such as a horizontal plane, as generally illustrated in FIG. 2B.

Lead offset 151x can be coupled to the inner end of lead step 151a. The outer end of lead offset 151x can be coupled to the inner end of lead step 151a, and lead offset 151x can be angled upwardly such that the inner end of lead offset 151x is higher than the outer end of lead offset 151x. Lead offset 151x can be arranged at a predetermined angle with respect to lead step 151a. In some examples, lead offset 151x can be referred to as a lead upset. Lead step 151b can be coupled to the inner end of lead offset 151x.

Lead step 151b can extend substantially horizontal, or substantially parallel to lead step 151a. The inner end of lead step 151b can face towards electronic component 11 and the outer end can face away from electronic component 11. Lead step 151b can have a length smaller than that of lead step 151a. Lead step 151b can be an example of a lead step residing on a second plane as generally illustrated in FIG. 2B, which is different (for example, above) than the first plane as described previously.

Lead offset 151y can be coupled to the inner end of lead step 151b. The outer end of lead offset 151y can be coupled to the inner end of lead step 151b, and lead offset 151y can be angled upwardly such that the inner end of lead offset 151y is higher than the outer end of lead offset 151y. Lead offset 151y can be arranged at a predetermined angle with respect to lead step 151b. In some examples, lead offset 151y can be referred to as a lead upset. Lead step 151c can be coupled to the inner end of lead offset 151y.

Lead step 151c can extend substantially horizontal, or substantially parallel to lead step 151a. The inner end of lead step 151c can face towards electronic component 11 and the outer end can face away from electronic component 11. Lead step 151c can have a length equal to or smaller than that of lead step 151b. Component interconnects 111 can be coupled to the top side of lead step 151c. Lead step 151c can be an example of a lead step that resides on a third plane as generally illustrated in FIG. 2B, which is different (for example, above) than the second plane described previously. In accordance with the present description, lead offsets 151x and 151y are configured to extend between lead steps 151a, 151b, and 151c so that the lead steps reside on different planes as generally illustrated in FIG. 2B. The top side of lead step 151c can be an example of a lead step side, such as a first lead step side or a second lead step side.

In some examples, lead terminal 151z can downwardly extend from the bottom side of lead step 151a, proximate to the outer end of lead step 151a. Lead terminal 151z can have a length smaller than that of lead step 151a.

Lead 152 can comprise lead steps 152a, 152b, and 152c, lead offsets 152x and 152y, and lead terminal 152z. Lead steps 152a, 152b, and 152c, lead offsets 152x and 152y, and lead terminal 152z can be integral with each other as part of a same or continuous piece. In some examples, lead steps 152a, 152b, 152c, lead offsets 152x, 152y, or lead terminal 152z, can be defined by a stamping, bending, or etching.

Lead step 152a can extend substantially horizontal, or substantially parallel to the first side of electronic component 11. The inner end of lead step 152a can face towards electronic component 11 and the outer end can face away from electronic component 11. Lead step 152a can be coupled by a tie-bar to neighboring lead steps 152a. Lead step 152a can be an example of a lead step residing on a fourth plane as generally illustrated in FIG. 2B. In some examples, the fourth plane is the same as the first plane described previously.

Lead offset 152x can be coupled to the inner end of lead step 152a. The outer end of lead offset 152x can be coupled to the inner end of lead step 152a, and lead offset 152x can be angled upwardly such that the inner end of lead offset 152x is higher than the outer end of lead offset 152x. Lead offset 152x can be arranged at a predetermined angle with respect to lead step 152a. In some examples, lead offset 152x can be referred to as a lead upset. Lead step 152b can be coupled to the inner end of lead offset 152x.

Lead step 152b can extend substantially horizontal, or substantially parallel to lead step 152a. The inner end of lead step 152b can face towards electronic component 11 and the outer end can face away from electronic component 11. Lead step 152b can have a length smaller than that of lead step 152a. Lead step 152b can be an example of a lead step residing on a fifth plane as generally illustrated in FIG. 2B, which can be different (for example, above) than the fourth plane. In some examples, the fifth plane can be the same as the second plane described previously.

Lead offset 152y can be coupled to the inner end of lead step 152b. The outer end of lead offset 152y can be coupled to the inner end of lead step 152b, and lead offset 152y can be angled upwardly such that the inner end of lead offset 152y is higher than the outer end of lead offset 152y. Lead offset 152y can be arranged at a predetermined angle with respect to lead step 152b. In some examples, lead offset 152y can be referred to as a lead upset. Lead step 152c can be coupled to the inner end of lead offset 152y.

Lead step 152c can extend substantially horizontal, or substantially parallel to lead step 152a. The inner end of lead step 152c can face towards electronic component 11 and the outer end can face away from electronic component 11. Lead step 152c can have a length equal or smaller than that of lead step 152b. Component interconnects 111 can be coupled to the top side of lead step 152c. Lead step 152c can be an example of a lead step that resides on a sixth plane that is different (for example, above) than the fifth plane. In some examples, the sixth plane can be the same as the third plane described previously. In accordance with the present description, lead offsets 152x and 152y are configured to extend between lead steps 152a, 152b, and 152c so the lead steps reside on different planes as generally illustrated in FIG. 2B. The top side of lead step 152c can be an example of a lead step side, such as a first lead step side or a second lead step side.

In some examples, lead terminal 152z can downwardly extend from the bottom side of lead step 152a, proximate to the outer end of lead step 152a. Lead terminal 152z can have a length smaller than that of lead step 152a.

FIG. 2C shows a cross-sectional view of semiconductor device 10 at a later stage of manufacture. In the example shown in FIG. 2C electronic component 12 can be coupled to substrate 15. In some examples, a first side of electronic component 12 can be coupled to substrate 15. In some examples, the first side of electronic component 12 can be referred to as a front side or an active side of electronic component 12 where device structures can be located. Electronic component 12 can comprise component interconnects 121 coupled to lead steps 151b and 152b of leads 151 and 152. In some examples, coupling of electronic component 12 with substrate 15 can be secured by a reflow process. In some examples, electronic component 12 can be similar to electronic component 11. In some examples, electronic component 11 and electronic component 11 can have different functionality. In some examples, electronic component 12 can have a thickness of about 50 μm to about 160 μm. In some examples, the size of electronic component 12 can be different (for example, larger) than that of electronic component 11. The bottom side of lead step 152b or the bottom side of lead step 151b can be an example of lead step side, such as a first lead step side or a second lead step side.

FIG. 2D shows a cross-sectional view of semiconductor device 10 at a later stage of manufacture. In the example shown in FIG. 2D, after electronic components 11 and 12 are coupled to substrate 15, encapsulant 16 can encapsulate electronic component 11, component 12, and substrate 15. In some examples, encapsulant 16 can expose a second side of electronic component 11 or a second side of electronic component 12 (see FIGS. 1B and 1C). In some examples, the top side of encapsulant 16 can be substantially coplanar with the second side of electronic component 11 (see FIG. 1B). In some examples, the bottom side of encapsulant 16 can be coplanar with the second side of electronic component 12 (see FIG. 1C). In some examples, the second side of first electronic component 11 and the second side of electronic component 12 can be referred to as bottom sides or inactive sides. Bottom sides of lead terminals 151z and 152z can be exposed to the bottom side of encapsulant 16 (see FIG. 1C). In the example shown in FIG. 2D, the outer lateral end of lead steps 151a or of lead step 152a can be exposed at a lateral side of encapsulant 16.

Encapsulant 16 can comprise or be referred to as a mold material, a protecting material, a mold compound, or a resin. In some examples, encapsulant 16 can comprise a filler-reinforced polymer, a polymer composite material, an epoxy resin, a polymer composite material, an epoxy resin having a filler, an epoxy acrylate having a filler, or a silicone resin. For example, encapsulant 16 can be provided using a compression molding process, transfer molding process, a film assisted molding process, a liquid phase encapsulant molding process, a vacuum lamination process, or a paste printing process. In some examples, encapsulant 16 can have a thickness of about 350 μm to about 1000 μm.

Figure 2E:
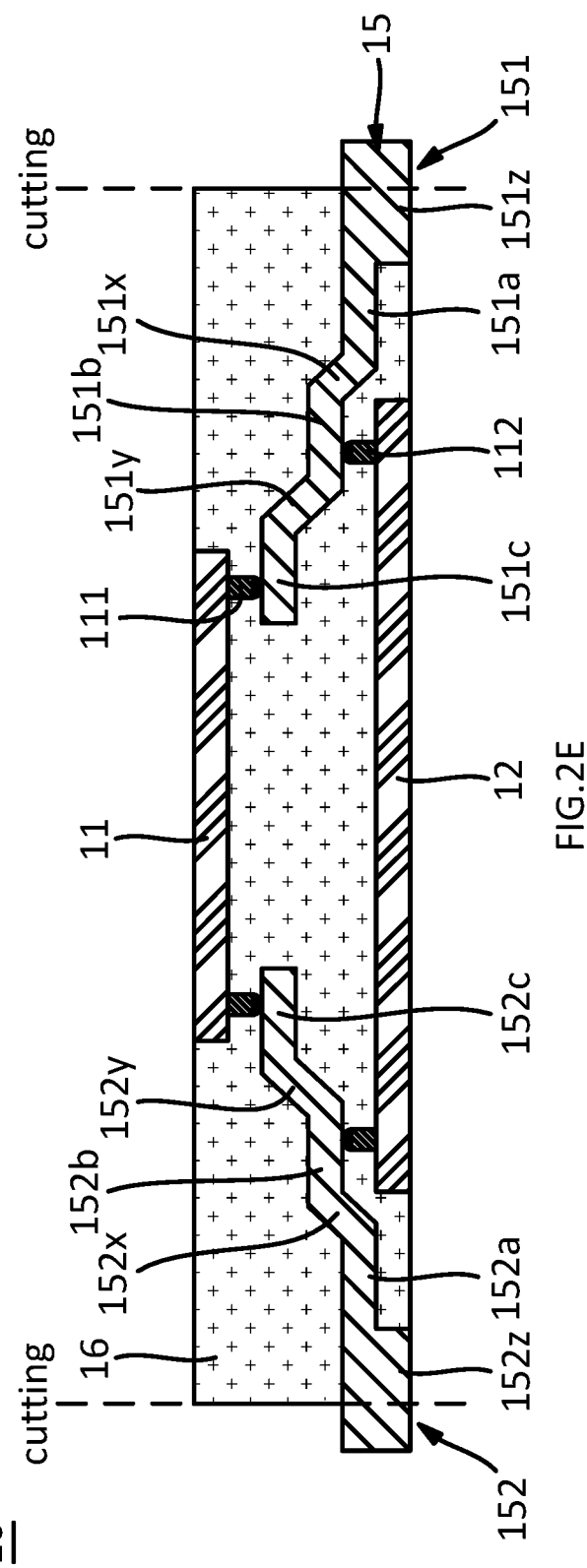

FIG. 2E shows a cross-sectional view of semiconductor device 10 at a later stage of manufacture. In the example shown in FIG. 2E, substrate 15 can be singulated into individual semiconductor devices 10 by, for example, sawing. In some examples, the sawing can be performed using a sawing tool, such as a diamond blade or laser beam. The sawing can be carried out along a boundary line between encapsulant 16 and substrate 15 (indicated by a dotted line of FIG. 2E). The sawing tool can cut a portion between encapsulant 16 and substrate 15 along the boundary line. Substrate 15 can be exposed at the lateral sides of encapsulant 16 after the singulation. The exposed portions can be outer lateral ends of lead steps 151a, 152a, and bottom sides of lead terminals 151z, 152z of substrate 15.

Figure 3C:
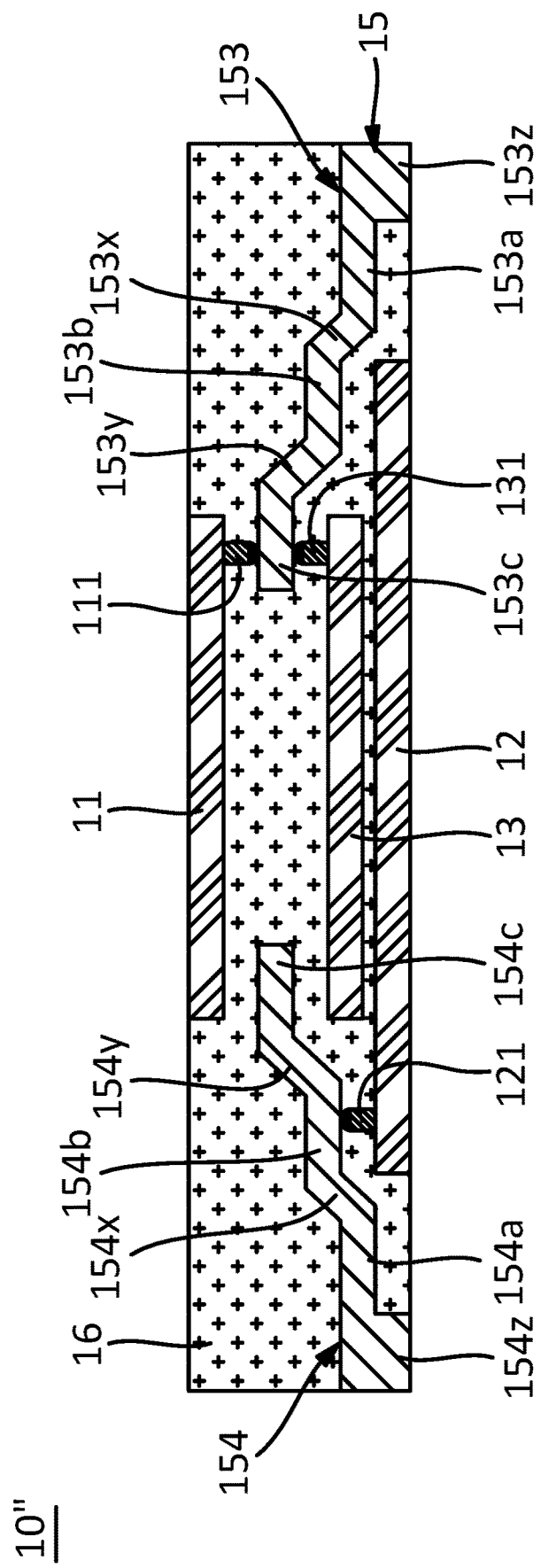

FIGS. 3A, 3B, and 3C show different cross-sectional views of example semiconductor device 10 or variations of it.

FIG. 3A shows a cross-sectional view taken along the line B of FIG. 1D. In the example shown in FIG. 3A, electronic component 11 of semiconductor device 10 can be coupled to lead 153 of substrate 15 but need not be coupled to lead 154. For instance, electronic component 11 can be coupled to lead step 153c of lead 153 by a component interconnect 111. Electronic component 12 can be coupled to lead 154 but need not be coupled to lead 153. For instance, electronic component 12 can be coupled to lead step 154b of lead 154 by a component interconnect 112. The top side of lead step 153c can be an example of a lead step side, such as a first lead step side or a second lead step side. The bottom side of lead step 154b can be an example of a lead step side, such as first lead step side or a second lead step side.

FIG. 3B shows a cross-sectional view of example semiconductor device 10'. Features, elements, or manufacture of semiconductor device 10' can be similar to those described with respect to FIGS. 2A-2E. In the example shown in FIG. 3B, semiconductor device 10' can comprise electronic components 11 and 12, component interconnects 111 and 121, substrate 15, and encapsulant 16. Lateral sides of lead steps 151a, 152a of substrate 15, and bottom sides of lead terminals 151z, 152z can be exposed from encapsulant 16. In some examples, the top side of electronic component 11 need not be exposed from the top side of encapsulant 16, or can be covered by encapsulant 16. In some examples, the bottom side of electronic component 12 need not be exposed from the bottom side of encapsulant 16, or can be covered by encapsulant 16. The top side of lead step 153c or the top side of lead step 154c can be an example of a lead step side, such as a first lead step side or a second lead step side. The bottom side of lead step 153b or the bottom side of lead step 154b can be an example of a lead step side, such as first lead step side or a second lead step side. The top side of lead step 152b can be an example of a lead step side, such as a first lead step side or a second lead step side. The bottom side of lead step 152b can be an example of a lead step side, such as a first lead step side or a second lead step side.

FIG. 3C shows a cross-sectional view of example semiconductor device 10". Features, elements, or manufacture of semiconductor device 10' can be similar to those described with respect to FIGS. 2A-2E. In the example shown in FIG. 3C, semiconductor device 10" can comprise electronic component 11, electronic component 12, electronic component 13 between electronic components 11 and 12, substrate 15, and encapsulant 16. Electronic component 13 can be similar to electronic component 11 or electronic component 12. Component interconnect 131 can couple electronic component 13 to substrate 15, such as to lead step 153c.

In some examples, electronic component 11 can be coupled to lead 153 but need not be coupled to lead 154. Electronic component 11 can be coupled to lead step 153c of lead 153 by component interconnect 111. In some examples, electronic component 12 can be coupled to lead 154 but need not be coupled to lead 153. Electronic component 12 can be coupled to lead step 154b of lead 154 by component interconnect 121. Electronic component 13 can be disposed between substrate 15 and electronic component 12. In some examples, electronic component 13 can be coupled to lead step 153c by component interconnect 131, but need not be coupled to lead step 154c. In some examples, electronic component 13 can be coupled to electronic component 11 via component interconnects 131, which are both coupled to lead 153 at lead step 153c.

In some examples, the top side of electronic component 11 or the bottom side or electronic component 12 can be exposed from encapsulant 16. In some examples, the top side of electronic component 11 or the bottom side or electronic component 12 can be covered by encapsulant 16. Encapsulant 16 can extend between electronic component 13 and electronic component 12, or can extend between electronic component 13 and electronic component 11. The top side of lead step 153c can be an example of a lead step side, such as a first lead step side or a second lead step side. The bottom side of lead step 153c can be an example of a lead step side, such as first lead step side or a second lead step side. The bottom side of lead step 154b can be an example of a lead step side, such as a first lead step side or a second lead step side.

Figure 4A:
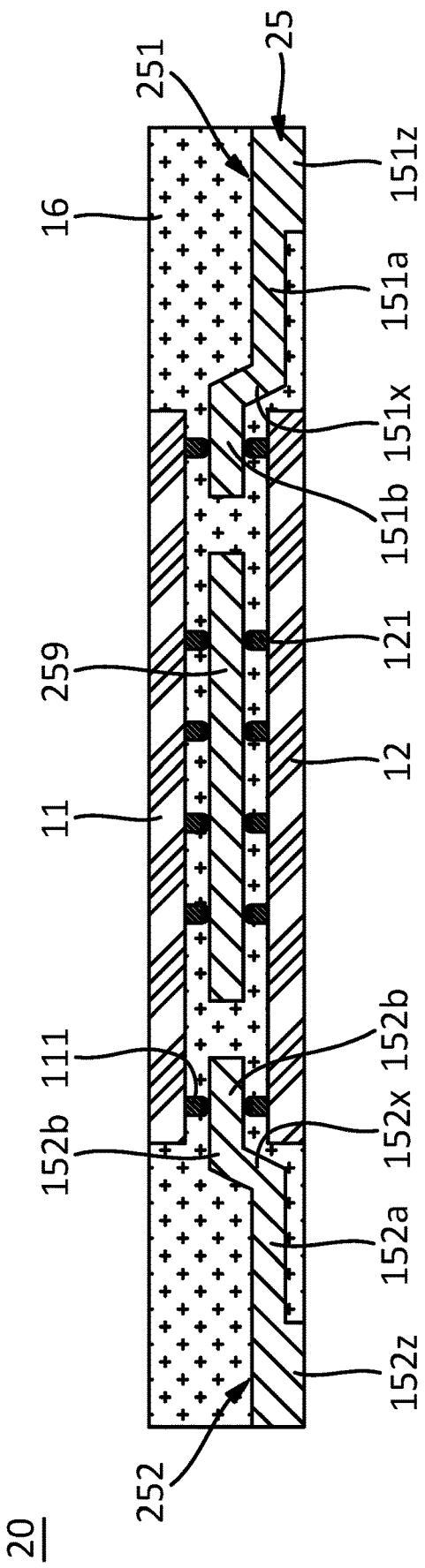
FIG. 4A shows a cross-sectional view of an example semiconductor device.
Figure 4C:
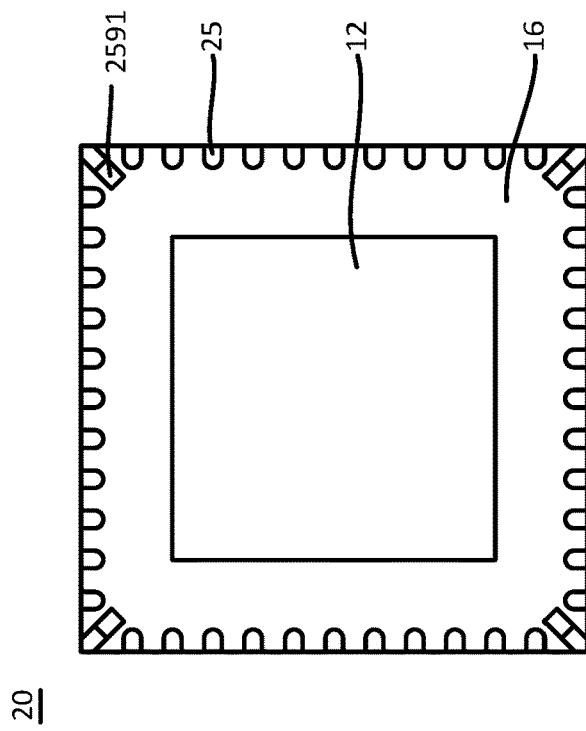
FIG. 4C shows a bottom view of an example semiconductor device.
Figure 4B:
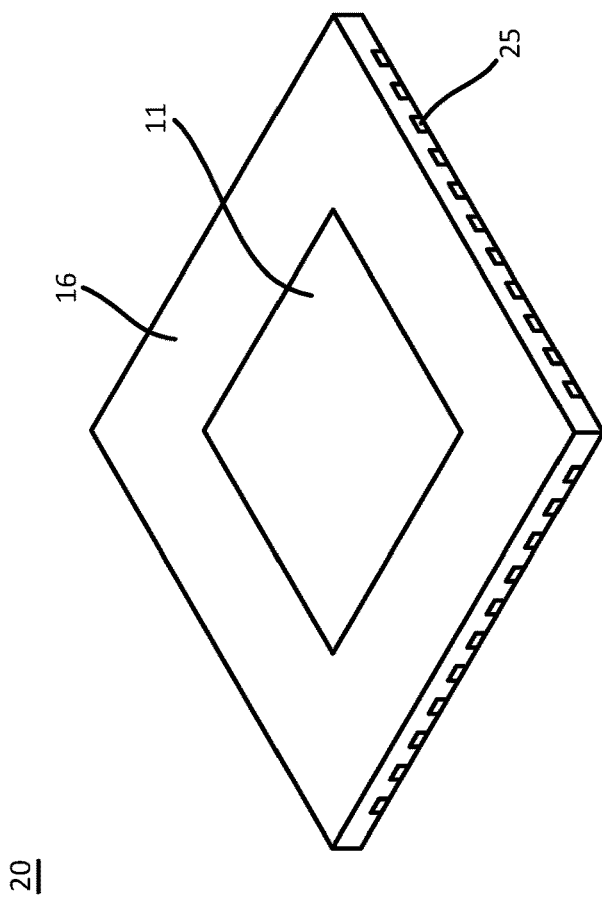
FIG. 4B shows a perspective view of an example semiconductor device.
Figure 4D:
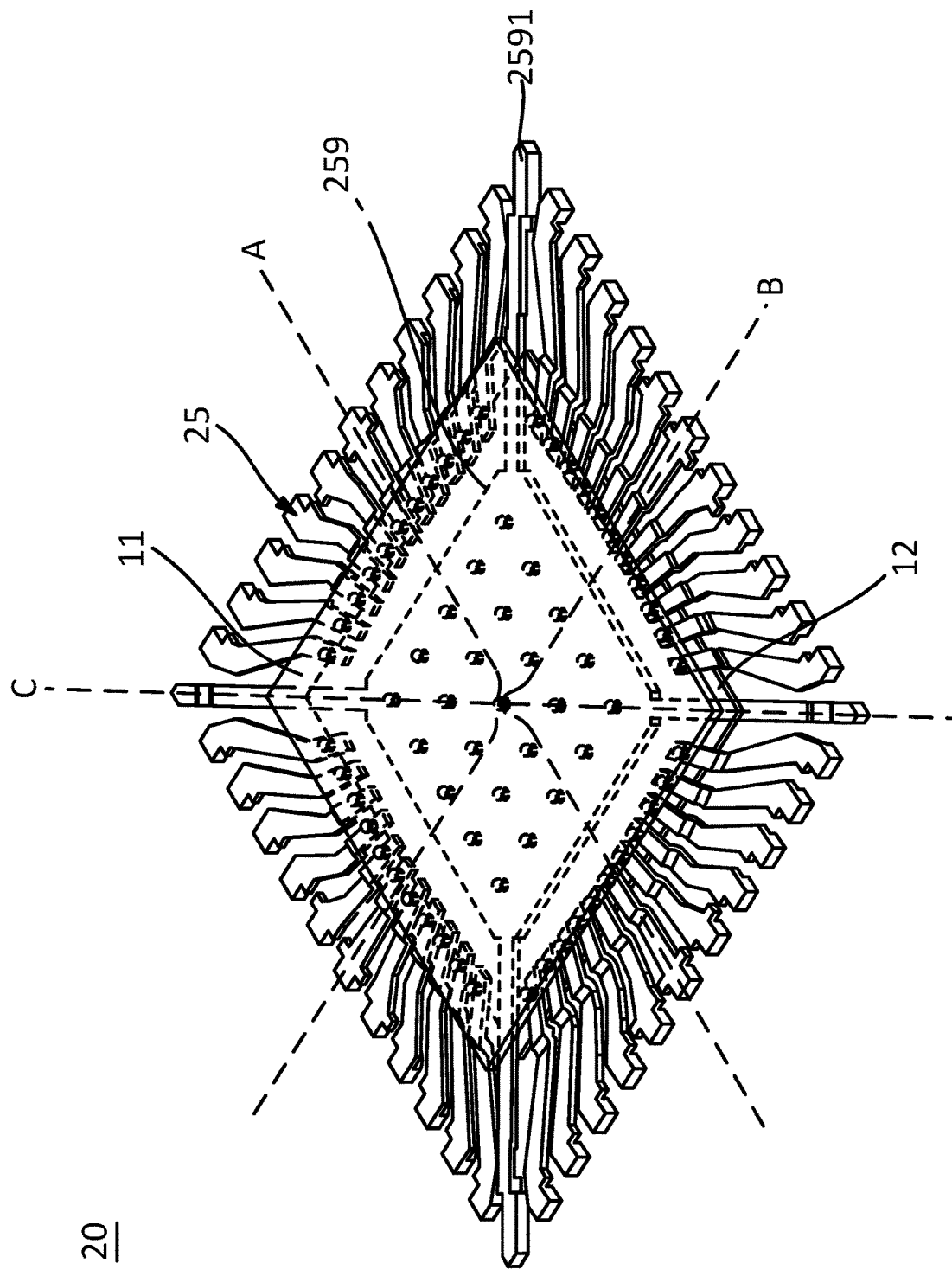
FIG. 4D shows a transparent perspective view of an example semiconductor device.

FIG. 4A shows a cross-sectional view of example semiconductor device 20. FIG. 4B shows a perspective view of example semiconductor device 20. FIG. 4C shows a bottom view of example semiconductor device 20. FIG. 4D shows a transparent perspective view of example semiconductor device 20. Features, elements, or manufacturing of semiconductor device 20 can be similar to corresponding ones of other semiconductor devices or processes of the present disclosure, such as semiconductor device 10 or FIGS. 1-2.

In the example shown in FIGS. 4A to 4D, semiconductor device 20 can comprise electronic components 11 and 12, substrate 25, and encapsulant 16. Electronic components 11 and 12 can comprise component interconnects 111 and 121, respectively. In some examples, substrate 25 can be similar to substrate 15. Electronic components 11 and 12 can be coupled to top and bottom sides of substrate 25.

Substrate 25 and encapsulant 16 can protect the electronic components 11 and 12 from an external factor and/or environmental exposure. Substrate 25 and component interconnects 111 and 121 can provide electrical coupling between an external component and electronic components 11 and 12.

Figure 4E:
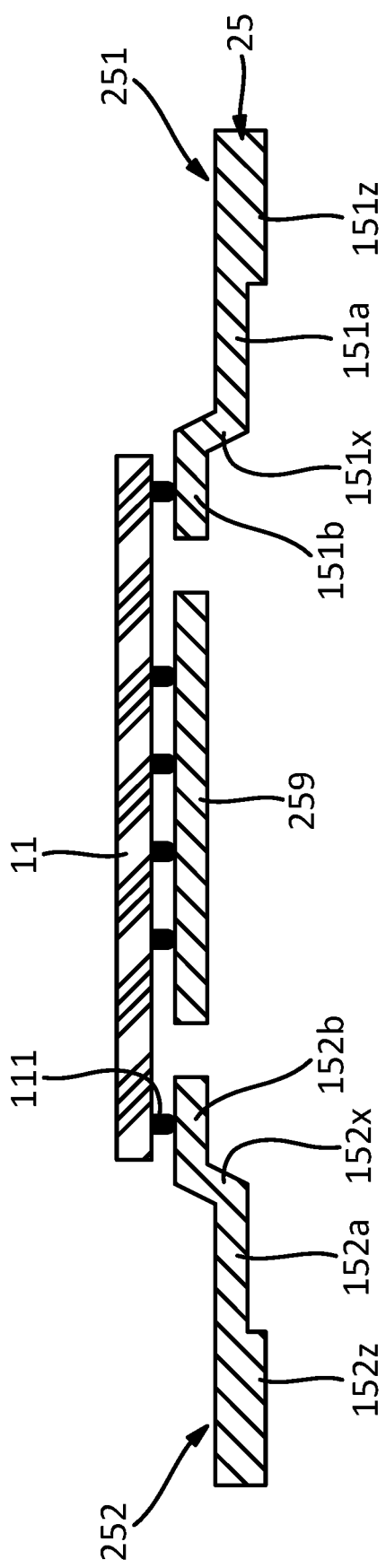
FIGS. 4E, 4F, and 4G show cross-sectional views of example method for manufacturing an example semiconductor device.
Figure 4F:
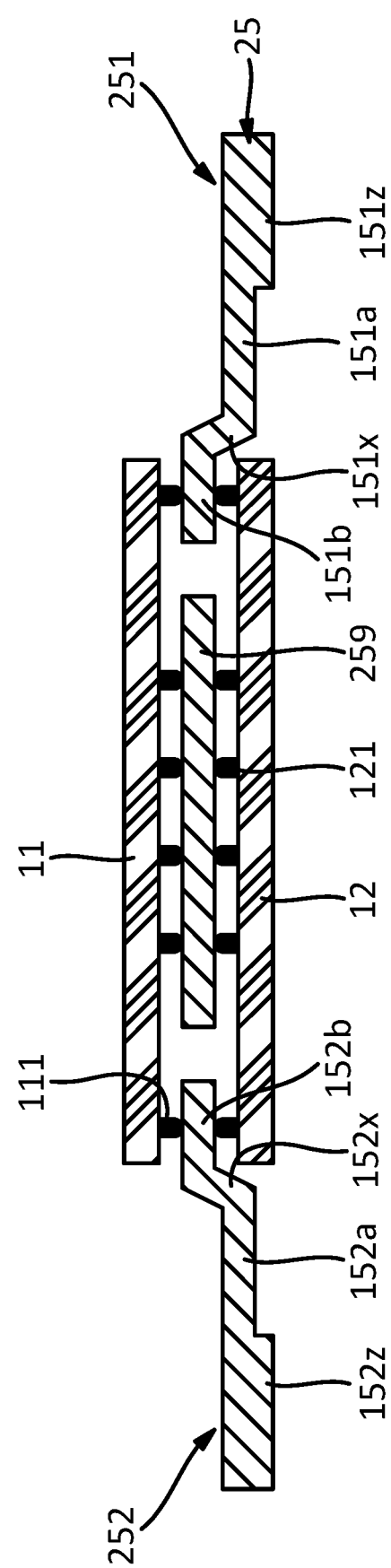
Figure 4G:
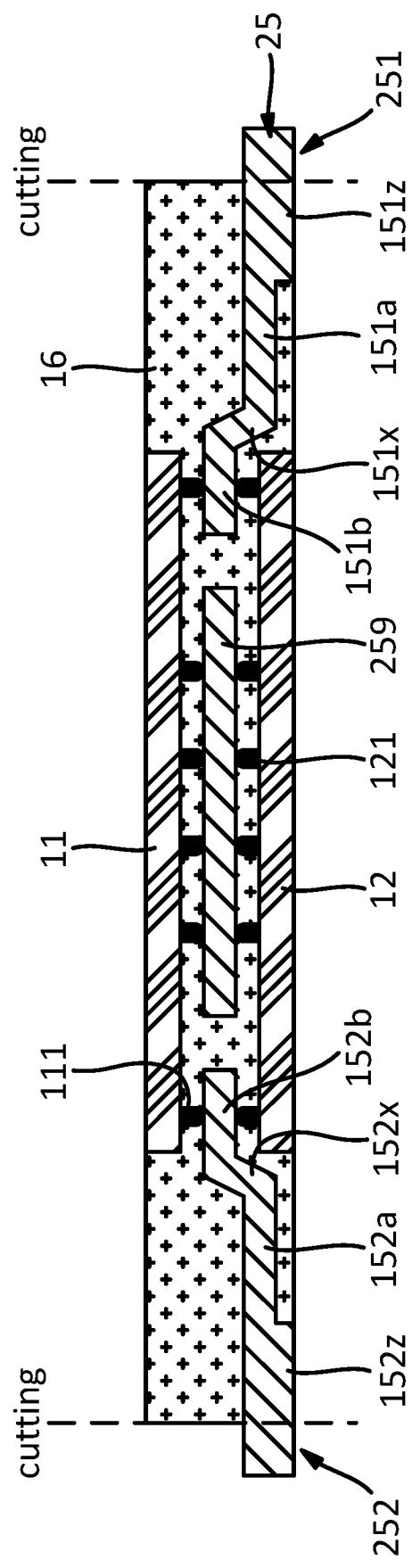

FIGS. 4E, 4F, and 4G show cross-sectional views of example method for manufacturing an example semiconductor device 20, with respect to line A of FIG. 4D.

FIG. 4E shows a cross section view of electronic device 20 at an early stage of manufacture. In the example shown in FIG. 4E, electronic component 11 can be coupled to substrate 25 by interconnects 111. In some examples, coupling of electronic component 11 with substrate 25 can be achieved by a reflow process. In some examples, substrate 25 can comprise or be referred to as a leadframe.

In the example shown in FIG. 4E, substrate 25 can comprise leads 251 and 252 disposed opposite each other. In some examples, leads 251 and 252 can have the similar shape to each other. Substrate 25 can comprise paddle 259 between leads 251 and 252.

Lead 251 can comprise lead steps 151a and 151b, lead offset 151x, and lead terminal 151z. Lead steps 151a and 151b, lead offset 151x, and lead terminal 151z can be integral with each other as part of a same or continuous piece. In some examples, the different features of lead 251 can be defined by stamping, bending, or etching.

Lead step 151a can extend substantially horizontal, or substantially parallel to first side of electronic component 11. The inner end of lead step 151a can face towards electronic component 11 and the outer end can face away from electronic component 11. Lead step 151a can be coupled by a tie-bar to neighboring lead steps 151a.

Lead offset 151x can be coupled to the inner end of lead step 151a. The outer end of lead offset 151x can be coupled to the inner end of lead step 151a, and lead offset 151x can be angled upwardly such that the inner end of lead offset 151x is higher than the outer end of lead offset 151x. Lead offset 151x can be arranged at a predetermined angle with respect to lead step 151a. In some examples, lead offset 151x can be referred to as a lead upset. Lead step 151b can be coupled to the inner end of lead offset 151x.

Lead step 151b can extend substantially horizontal, or substantially parallel to lead step 151a. The inner end of lead step 151b can face towards electronic component 11 and the outer end can face away from electronic component 11. Lead step 151b can have a length smaller than that of lead step 151a. Component interconnects 111 of electronic component 11 can be coupled to the top side of lead step 151b.

In some examples, lead terminal 151z can downwardly extend from the bottom side of lead step 151a, proximate to the outer end of lead step 151a. Lead terminal 151z can have a length smaller than that of lead step 151a.

Lead 252 can comprise lead steps 152a, 152b, lead offset 152x, and lead terminal 152z. Lead steps 152a, 152b, lead offset 152x, and lead terminal 152z can be integral with each other as part of a same or continuous piece. In some examples, lead steps 152a, 152b, lead offset 152x, or lead terminal 152z, can be defined by a stamping, bending, or etching.

Lead step 152a can extend substantially horizontal, or substantially parallel to first side of electronic component 11. The inner end of lead step 152a can face towards electronic component 11 and the outer end can face away from electronic component 11. Lead step 152a can be coupled by a tie-bar to neighboring lead steps 152a.

Lead offset 152x can be coupled to the inner end of lead step 152a. The outer end of lead offset 152x can be coupled to the inner end of lead step 152a, and lead offset 152x can be angled upwardly such that the inner end of lead offset 152x is higher than the outer end of lead offset 152x. Lead offset 152x can be arranged at a predetermined angle with respect to lead step 152a. In some examples, lead offset 152x can be referred to as a lead upset. Lead step 152b can be coupled to the inner end of lead offset 152x.

Lead step 152b can extend substantially horizontal, or substantially parallel to lead step 152a. The inner end of lead step 152b can face towards electronic component 11 and the outer end can face away from electronic component 11. Lead step 152b can have a length smaller than that of lead step 152a. Component interconnects 111 can be coupled to the top side of lead step 152b.

In some examples, lead terminal 152z can downwardly extend from the bottom side of lead step 152a, proximate to the outer end of lead step 152a. Lead terminal 152z can have a length smaller than that of lead step 152a.

In some examples, paddle 259 can be provided by punching or etching a portion substrate 25. In some examples, paddle 259 can be substantially coplanar with lead steps 151b and 152b. Paddle 259 can comprise a ground plane in some implementations. Component interconnects 111 of electronic component 11 can be coupled to the top side of paddle 259. Paddle 259 can comprise extensions 2591 for grounding (see FIG. 4D). In some examples, extensions 2591 can be referred as tie bars or fingers. Extensions 2591 can be arranged spaced apart from the leads (251 and 252 of FIG. 4E; 253 and 254 of FIG. 4H). In some examples, paddle 259 can be provided in a rectangular shape, and extensions 2591 can be coupled to vertices of paddle 259.

FIG. 4F shows a cross-sectional view of semiconductor device 20 at a later stage of manufacture. In the example shown in FIG. 4F, electronic component 12 can be coupled to a bottom side of substrate 25 and a bottom side of paddle 259. Electronic component 12 can comprise component interconnects 121. Component interconnects 121 can be coupled to lead steps 151b, 152b of leads 251, 252, or to paddle 259. In some examples, the bottom side of electronic component 12 can be coplanar with the bottom side of lead terminals 151z, 152z. In some examples coupling of electronic component 12 with substrate 25 can be achieved by a reflow process. In some examples, electronic component 12 can be similar to electronic component 11. In other examples, electronic components 11 and 12 can have different functionality. In some examples, electronic component 11 can be coupled to electronic component 12 via respective component interconnects 111, 121 that are coupled to lead 251 at lead step 151b, or coupled to lead 252 at lead step 152b. The top side of lead step 151b can be an example of a lead step side, such as a first lead step side or a second lead step side. The bottom side of lead step 151b can be an example of a lead step side, such as first lead step side or a second lead step side. The top side of lead step 152b can be an example of a lead step side, such as a first lead step side or a second lead step side. The bottom side of lead step 152b can be an example of a lead step side, such as a first lead step side or a second lead step side.

FIG. 4G shows a cross-sectional view of semiconductor device 20 at a later stage of manufacture. In the example shown in FIG. 4G, after electronic components 11 and 12 are coupled to substrate 25, encapsulant 16 can encapsulate electronic components 11 and 12 and substrate 25. Thereafter, substrate 25 can be separated into individual semiconductor devices 20 by sawing or singulation. The manufacturing stage of FIG. 4G can be similar to that described for the manufacturing stages of FIGS. 2D and 2E. In the example shown in FIG. 4G, encapsulant 16 can expose the top side of electronic component 11 and the bottom side of electronic component 12 (see FIGS. 4B and 4C). In some examples, the top side of encapsulant 16 can be substantially coplanar with the top side of electronic component 11 (see FIG. 4B). In some examples, the bottom side of encapsulant 16 can be coplanar with the bottom side of electronic component 12 (see FIG. 4C). Bottom sides of lead terminals 151z, 152z can be exposed at the bottom side of encapsulant 16 (see FIG. 4C). Outer lateral ends of lead steps 151a, 152a can be exposed at the lateral sides of encapsulant 16 after singulation.

Figure 4H:
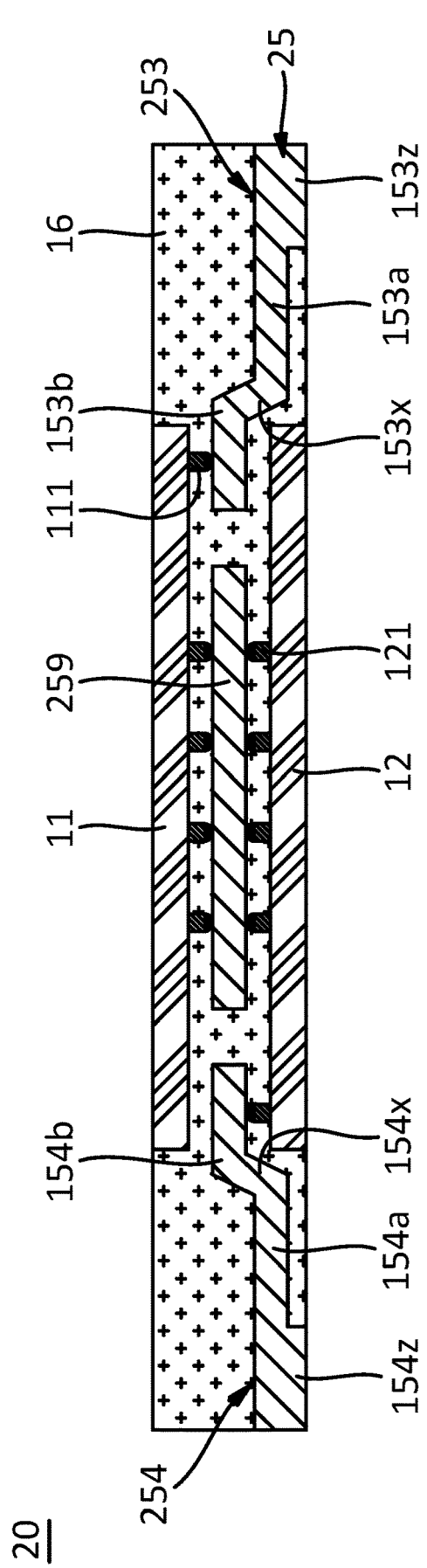
FIGS. 4H and 4I show cross-sectional views of example semiconductor devices.

FIG. 4H shows a cross-sectional view taken along the line B of FIG. 4D. As seen in FIG. 4H, electronic component 11 can be coupled to lead 253 and paddle 259 but need not be coupled to lead 254. In some examples, electronic component 11 can be coupled to lead step 153b of lead 253 and paddle 259 by component interconnects 111. Electronic component 12 can be coupled to lead 254 and paddle 259 but need not be coupled to lead 253. In some examples, electronic component 12 can be coupled to lead step 154b of lead 254 and paddle 259 by interconnects 121.

Figure 4I:
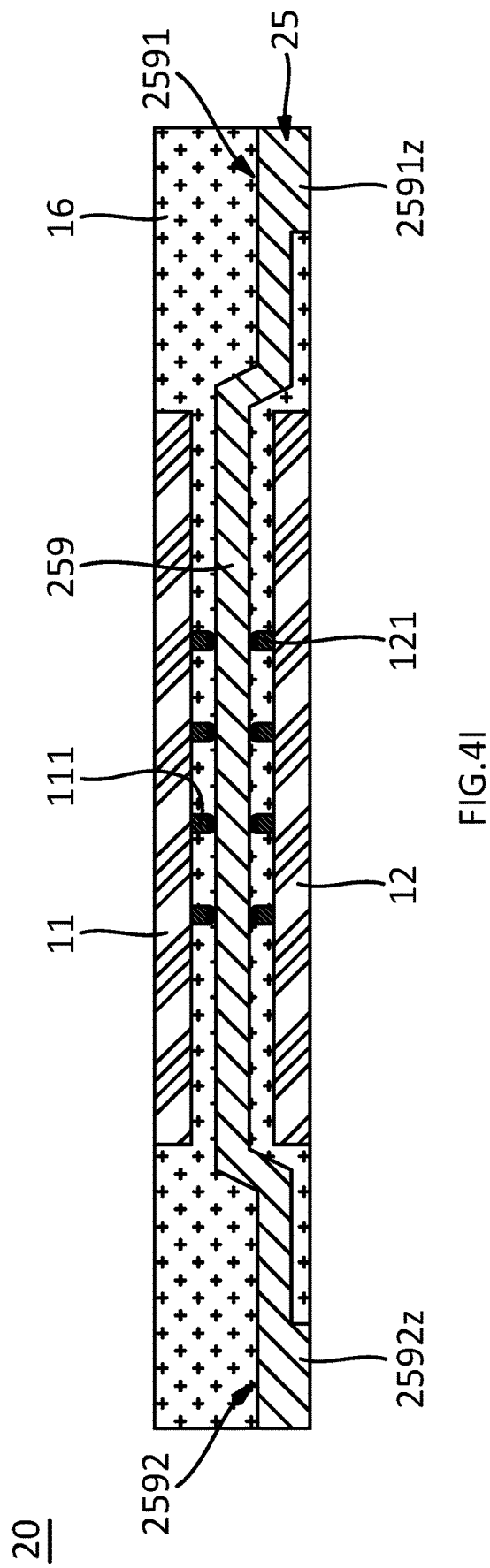

FIG. 4I shows a cross-sectional view taken along the line C of FIG. 4D. As shown in FIG. 4I, electronic components 11 and 12 can be coupled to paddle 259. In some examples, electronic component 11 can be coupled to paddle 259 by component interconnects 111, and electronic component 12 can be coupled to paddle 259 by component interconnects 121.

Substrate 25 can comprise paddle 259 and extensions 2591 and 2592 each having extension terminals 2591z and 2592z respectively. In some examples, extensions 2591 and 2592 can be referred as tie bars or fingers. Extensions 2591 and 2592 can be similar to leads 251, 252, 253, and 254, but are coupled to paddle 259. Paddle 259 and extensions 2591 and 2592 can be integral with each other as part of a same or continuous piece. In some examples, paddle 259 can be positioned between electronic component 11 and electronic component 12 and can be parallel with electronic components 11 and 12. Extension 2591 can be coupled to one end of paddle 259, and extension 2592 can be coupled to another end of paddle 259. Top sides of extensions 2591 and 2592 can be positioned to be lower than paddle 259. In some examples, extension 2591 and extension 2592 can be symmetrical with each other. Extension terminal 2591z can be provided under extension 2591, and extension terminal 2592z can be provided under extension 2592. The bottom sides of extension terminals 2591z and 2592z can be exposed at a bottom side of encapsulant 16. Outer lateral ends of extension terminals 2591z and 2592z can be exposed at a lateral side of encapsulant 16.

Figure 5A:
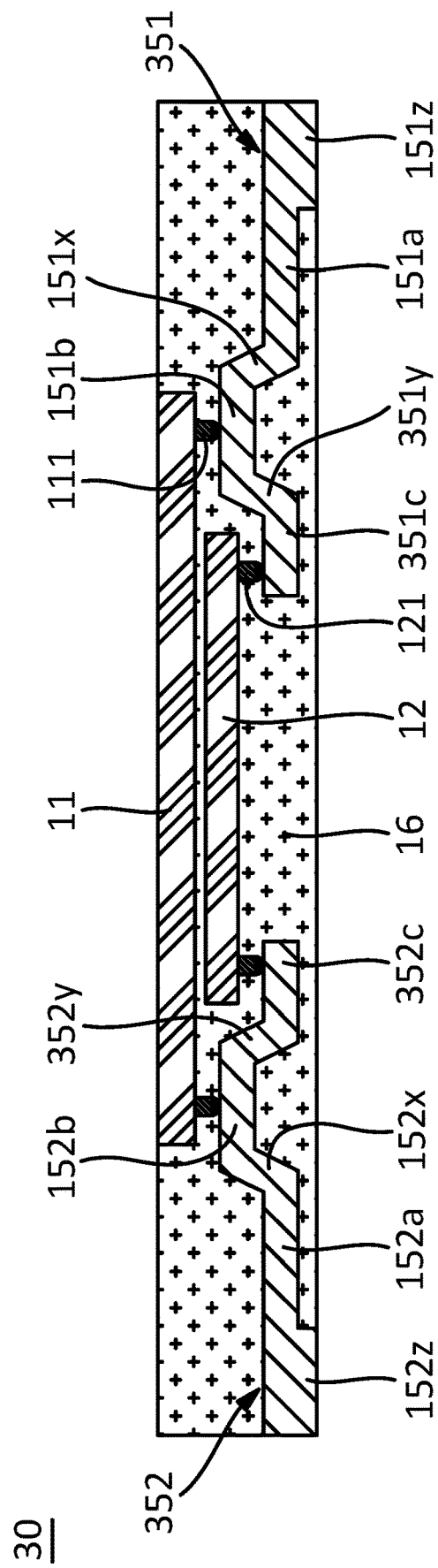
FIG. 5A shows a cross-sectional view of an example semiconductor device.
Figure 5C:
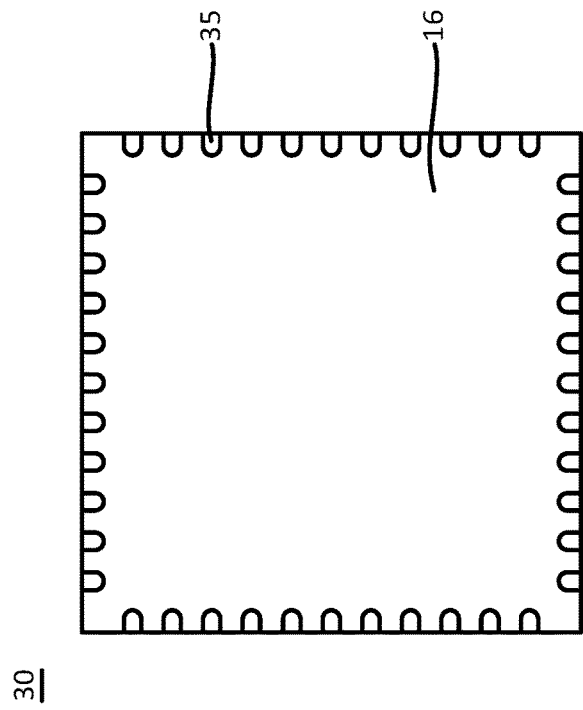
FIG. 5C shows a bottom view of an example semiconductor device.
Figure 5B:
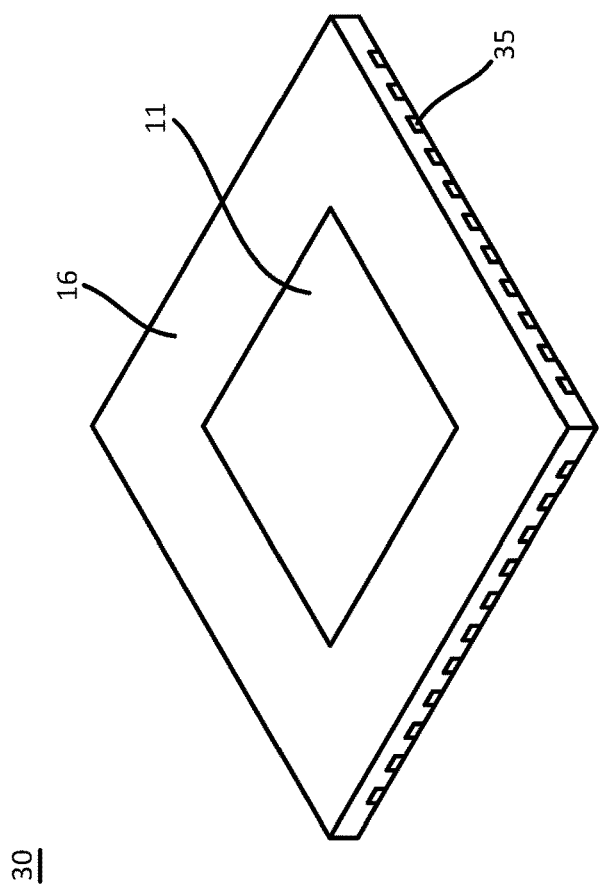
FIG. 5B shows a perspective view of an example semiconductor device.
Figure 5D:
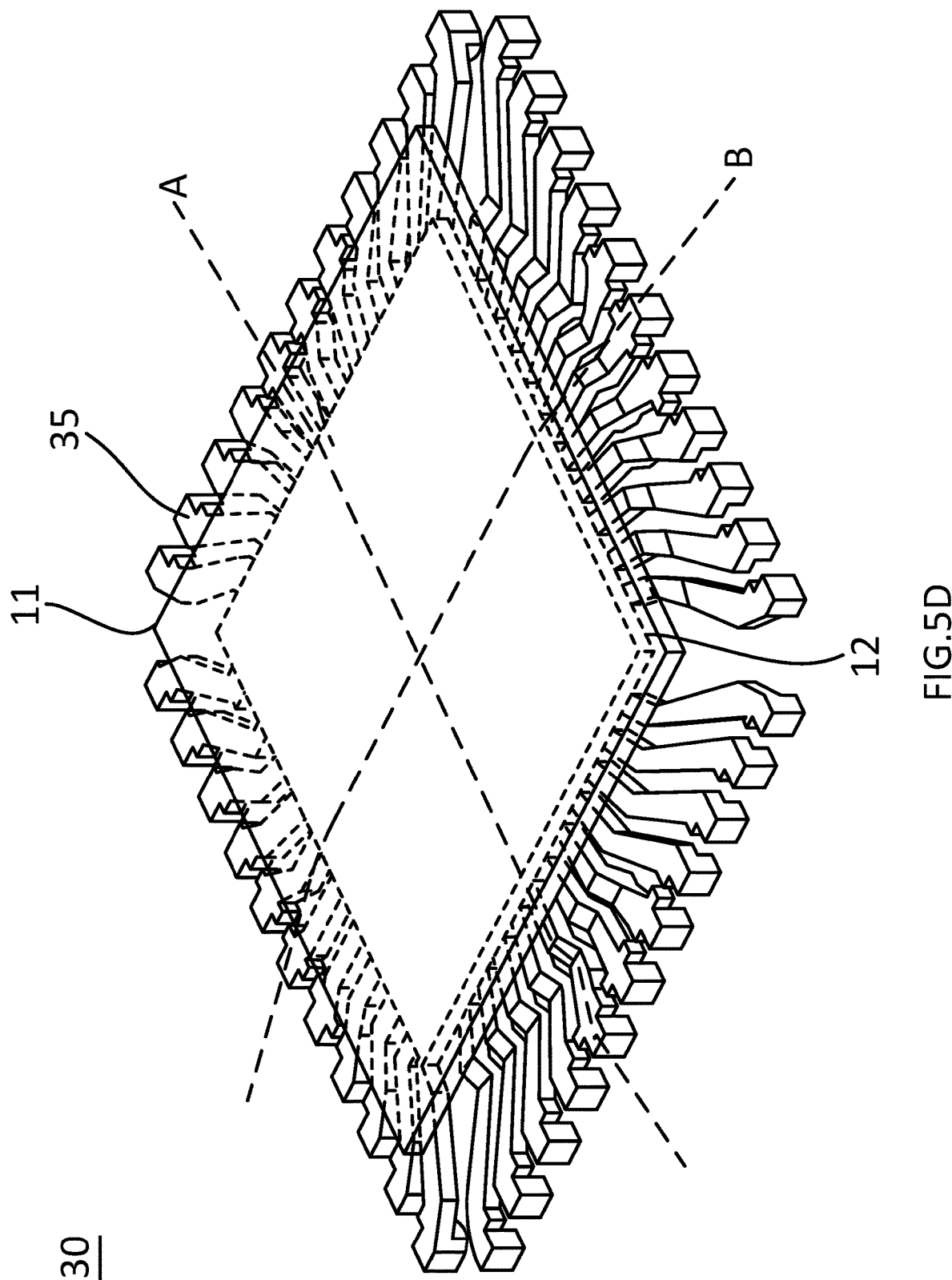
FIG. 5D shows a transparent perspective view of an example semiconductor device.

FIG. 5A shows a cross-sectional view of an example semiconductor device 30. FIG. 5B shows a perspective view of example semiconductor device 30. FIG. 5C shows a bottom view of example semiconductor device 30. FIG. 5D shows a transparent perspective view of example semiconductor device 30. Features, elements, or manufacturing of semiconductor device 30 can be similar to corresponding ones of other semiconductor devices or processes of the present disclosure, such as semiconductor device 10 or 20 or FIGS. 1-4.

In the example shown in FIGS. 5A to 5D, semiconductor device 30 can comprise electronic components 11 and 12, substrate 35, and encapsulant 16. Electronic components 11 and 12 can comprise component interconnects 111 and 121, respectively. In some examples, substrate 35 can be similar to substrate 15 or 25. Electronic components 11 and 12 can be coupled to the top side of substrate 35.

Substrate 35 and encapsulant 16 can protect the electronic components 11 and 12 from an external factor and/or environmental exposure. Substrate 35 and component interconnects 111 and 121 can provide electrical coupling between an external component and electronic components 11 and 12.

Figure 5E:
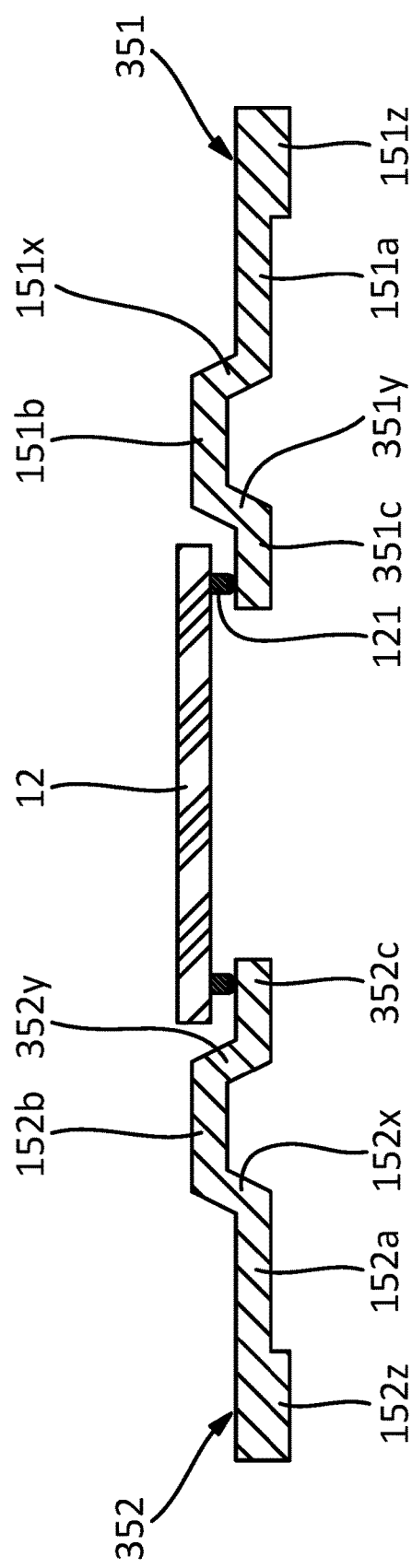
FIGS. 5E and 5F show cross-sectional views of example method for manufacturing an example semiconductor device.
Figure 5F:
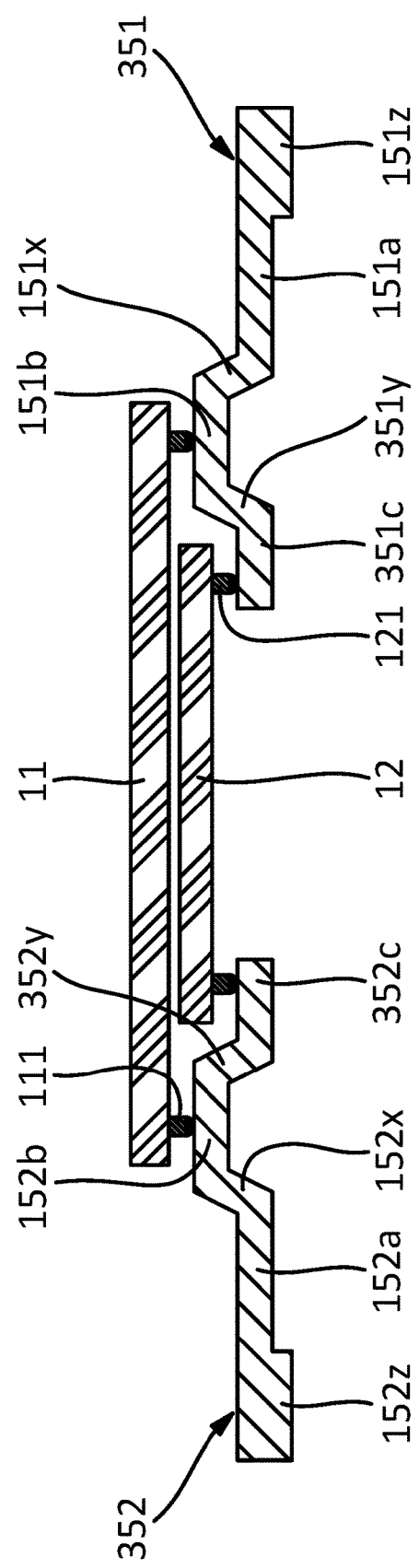

FIGS. 5E, 5F, 5G, and 5H show cross-sectional views of an example method for manufacturing an example semiconductor device 30, with respect to line A of FIG. 5D for FIGS. 5E, 5F, and 5G and with respect to line B of FIG. 5D for FIG. 5H.

FIG. 5E shows a cross section view of electronic device 30 at an early stage of manufacture. In the example shown in FIG. 5E, electronic component 12 having component interconnects 121 can be coupled to substrate 35. In some examples, coupling of electronic component 12 with substrate 35 can be achieved by a reflow process. In some examples, substrate 35 can comprise or be referred to as a leadframe. In some examples, a portion of the top side of lead 351 or lead 352 can be higher than the bottom side of electronic component 12.

In the example shown in FIG. 5E, substrate 25 can comprise leads 351 and 352 disposed opposite each other. Leads 351 and 352 can have the similar shape to each other.

Lead 351 can comprise lead steps 151a, 151b, and 351c, lead offsets 151x and 351y, and lead terminal 151z. Lead steps 151a, 151b, and 351c, lead offsets 151x and 351y, and lead terminal 151z can be integral with each other as part of a same or continuous piece. In some examples, lead steps 151a, 151b, 351c, lead offsets 151x, 351y, or lead terminal 351z, can be defined by stamping, bending, or etching.

Lead step 151a can extend substantially horizontal, or substantially parallel to the first side of electronic component 11. The inner end of lead step 151a can face towards electronic component 11 and the outer end can face away from electronic component 11. Lead step 151a can be coupled by a tie-bar to neighboring lead steps 151a. Lead step 151a can be an example of a lead step that resides on a first plane, such as a horizontal plane, as generally illustrated in FIG. 5E.

Lead offset 151x can be coupled to the inner end of lead step 151a. The outer end of lead offset 151x can be coupled to the inner end of lead step 151a, and lead offset 151x can be angled upwardly such that the inner end of lead offset 151x is higher than the outer end of lead offset 151x. Lead offset 151x can be arranged at a predetermined angle with respect to lead step 151a. In some examples, lead offset 151x can be referred to as a lead upset.

Lead step 151b can be coupled to the inner end of lead offset 151x. Lead step 151b can extend substantially horizontal, or substantially parallel to lead step 151a. The inner end of lead step 151b can face towards electronic component 11 and the outer end can face away from electronic component 11. Lead step 151b can have a length smaller than that of lead step 151a. Lead step 151b can be an example of a lead step residing on a second plane as generally illustrated in FIG. 5E, which is different (for example, above) the first plane as described previously.

Lead offset 351y can be coupled to the inner end of lead step 151b. The outer end of lead offset 351y can be coupled to the inner end of lead step 151b, and lead offset 351y can be angled downwardly such that the inner end of lead offset 351y is lower than the outer end of lead offset 351y. Lead offset 351y can be arranged at a predetermined angle with respect to lead step 151b. In some examples, lead offset 351y can be referred to as a lead downset.

Lead step 351c can be coupled to the inner end of lead offset 351y. Lead step 351c can extend substantially horizontal, or substantially parallel to lead step 151a. The inner end of lead step 351c can face towards electronic component 11 and the outer end can face away from electronic component 11. Lead step 351c can have a length equal or smaller than that of lead step 151b. Component interconnects 111 can be coupled to the top side of lead step 351c. Lead step 351c can be an example of a lead step that resides on a third plane as generally illustrated in FIG. 5E, which is different (for example, below) the second plane described previously. In examples, the third plane can be the same as the first plane.

In some examples, lead terminal 151z can downwardly extend from the bottom side of lead step 151a, proximate to the outer end of lead step 151a. Lead terminal 151z can have a length smaller than that of lead step 151a.

Lead 352 can comprise lead steps 152a, 152b, and 352c, lead offsets 152x and 352y, and lead terminal 152z. Lead steps 152a, 152b, and 352c, lead offsets 152x and 352y, and lead terminal 152z can be integral with each other as part of a same or continuous piece. In some examples, lead steps 152a, 152b, 352c, lead offsets 152x, 152y, or lead terminal 352z, can be defined by stamping, bending, or etching.

Lead step 152a can extend substantially horizontal, or substantially parallel to the first side of electronic component 11. The inner end of lead step 152a can face towards electronic component 11 and the outer end can face away from electronic component 11. Lead step 152a can be coupled by a tie-bar to neighboring lead steps 152a. Lead step 152a can be an example of a lead step that resides on a fourth plane, such as a horizontal plane, as generally illustrated in FIG. 5E. In some examples, the fourth plane can be the same as the first plane.

Lead offset 152x can be coupled to the inner end of lead step 152a. The outer end of lead offset 152x can be coupled to the inner end of lead step 152a, and lead offset 152x can be angled upwardly such that the inner end of lead offset 152x is higher than the outer end of lead offset 152x. Lead offset 152x can be arranged at a predetermined angle with respect to lead step 152a. In some examples, lead offset 152x can be referred to as a lead upset.

Lead step 152b can be coupled to the inner end of lead offset 152x. Lead step 152b can extend substantially horizontal, or substantially parallel to lead step 152a. The inner end of lead step 152b can face towards electronic component 11 and the outer end can face away from electronic component 11. Lead step 152b can have a length smaller than that of lead step 152a. Lead step 152b can be an example of a lead step residing on a fifth plane as generally illustrated in FIG. 5E, which is different (for example, above) the fourth plane as described previously. In some examples, the fifth plane can be the same as the third plane.

Lead offset 352y can be coupled to the inner end of lead step 152b. The outer end of lead offset 352y can be coupled to the inner end of lead step 152b, and lead offset 352y can be angled downwardly such that the inner end of lead offset 352y is lower than the outer end of lead offset 352y. Lead offset 352y can be arranged at a predetermined angle with respect to lead step 152b. In some examples, lead offset 352y can be referred to as a lead downset.

Lead step 352c can be coupled to the inner end of lead offset 352y. Lead step 352c can extend substantially horizontal, or substantially parallel to lead step 152a. The inner end of lead step 352c can face towards electronic component 11 and the outer end can face away from electronic component 11. Lead step 352c can have a length equal or smaller than that of lead step 152b. Component interconnects 111 can be coupled to the top side of lead step 352c. Lead step 352c can be an example of a lead step that resides on a sixth plane as generally illustrated in FIG. 5E, which is different (for example, below) the fifth plane as described previously. In some examples, the sixth plane can be the same as third plane.

In some examples, lead terminal 152z can downwardly extend from the bottom side of lead step 152a, proximate to the outer end of lead step 152a. Lead terminal 152z can have a length smaller than that of lead step 152a.

FIG. 5F shows a cross-sectional view of semiconductor device 30 at a later stage of manufacture. In the example shown in FIG. 5F, electronic component 11 can positioned over electronic component 12 and coupled to substrate 35. In some examples, electronic component 11 can be coupled to top sides of lead steps 151b and 152b. In some cross-sections, electronic component 11 can have a larger width than electronic component 12. In some examples, electronic component 11 and electronic component 12 can be coupled. In some examples, electronic component 11 can be coupled to electronic component 12 via respective component interconnects 111 and 121 that are coupled to lead 351 or lead 352. The top side of lead step 151b can be an example of a lead step side, such as a first lead step side or a second lead step side. The top side of lead step 351c can be an example of a lead step side, such as first lead step side or a second lead step side. The top side of lead step 152b can be an example of a lead step side, such as a first lead step side or a second lead step side. The top side of lead step 352c can be an example of a lead step side, such as a first lead step side or a second lead step side.

FIG. 5G shows a cross-sectional view of semiconductor device 30 at a later stage of manufacture. In the example shown in FIG. 5G, after electronic components 11 and 12 are coupled to substrate 35, encapsulant 16 can encapsulate electronic components 11 and 12 and substrate 25. Substrate 35 and encapsulant 16 can be singulated to define individual semiconductor devices 30. The manufacturing stage of FIG. 5G can be similar to the manufacturing stages of FIGS. 2D-2E. In some examples, the top side of electronic component 11 can be exposed from encapsulant 16 (see FIG. 5B). In some examples, the top side of electronic component 11 can be covered by encapsulant 16. In some examples, encapsulant 16 can fill a space between electronic component 11 and electronic component 12. The bottom sides of lead terminals 151z and 152z can be exposed from the bottom side of encapsulant 16 (see FIG. 5C). Bottom sides of lead terminals 151z, 152z can be exposed at the bottom side of encapsulant 16 (see FIG. 5C). Outer lateral ends of lead steps 151a, 152a can be exposed at the lateral sides of encapsulant 16 after singulation.

FIG. 5H shows a cross-sectional view taken along the line B of FIG. 5D. As seen in FIG. 5H, electronic component 11 can be coupled to lead 354 but need not be coupled to lead 353. In some examples, electronic component 11 can be coupled to lead step 154b of lead 354 by component interconnect 111. Electronic component 12 can be coupled to lead 353 but need not be coupled to lead 354. In some examples, electronic component 12 can be coupled to lead step 353c of lead 353 by interconnect 121.

The present disclosure includes reference to certain examples, however, it will be understood by those skilled in the art that various changes may be made and equivalents may be substituted without departing from the scope of the

What is claim is:

1. A semiconductor device, comprising:
   a substrate comprising leads, the leads comprising:
      lead terminals;
      lead steps; and
      lead offsets extending between the lead steps so that at least some lead steps reside on different planes;
   a first electronic component coupled to a first lead step side, the first electronic component comprising:
      a first electronic component first side comprising a first active side; and
      a first electronic component second side opposite to the first electronic component first side;
   a second electronic component coupled to a second lead step side, the second electronic component comprising:
      a second electronic component first side comprising a second active side; and
      a second electronic component second side opposite to the second electronic component first side;
   conductive bumps comprising a first conductive bump and a second conductive bump; and
   an encapsulant encapsulating the first electronic component, the second electronic component, the first conductive bump, the second conductive bump, and portions of the substrate,
   wherein:
      the first active side faces and is connected to the first lead step side with the first conductive bump;
      the second active side faces and is connected to the second lead step side with the second conductive bump;
      the lead terminals are exposed from a first side of the encapsulant;
      the first electronic component second side is exposed from a second side of the encapsulant; and
      the second side of the encapsulant is different than the first side of the encapsulant.

2. The semiconductor device of claim 1, wherein:
   the first lead step side is a top side of a first lead step; and
   the second lead step side is a bottom side of a second lead step that is different than the first lead step.

3. The semiconductor device of claim 1, further comprising:
   a third electronic component coupled to a third lead step side, wherein:
      the third electronic component is interposed between the first electronic component and the second electronic component; and
      the encapsulant encapsulates the third electronic component.

4. The semiconductor device of claim 1, wherein:
   each lead comprises a continuous piece; and
   the lead steps extend substantially parallel to each other.

5. The semiconductor device of claim 1, wherein:
   the lead offsets are arranged at angles with respect to the lead steps; and
   some of the angles are downward angles such that some of the lead steps disposed inward towards the first electronic component are lower than other lead steps disposed outward from the first electronic component.

6. The semiconductor device of claim 1, wherein:
   the lead offsets are arranged at angles with respect to the lead steps; and
   the angles are upward angles such that the lead steps disposed inward towards the first electronic component are higher than the lead steps disposed outward from the first electronic component.

7. The semiconductor device of claim 1, wherein:
   the lead steps comprise different lengths.

8. The semiconductor device of claim 1, wherein:
   the lead terminals downwardly extend from bottom sides of outermost lead steps;
   the lead terminals each comprise:
      an outer edge exposed from and coplanar with a third side of the encapsulant;
      an inner edge opposite to the outer edge; and
      a lower side;
   the encapsulant encapsulates each of the inner edges; and
   the lower side of each lead terminal is exposed from and coplanar with the first side of the encapsulant.

9. The semiconductor device of claim 1, wherein:
   the leads include a first lead;
   the first lead comprises:
      a first lead terminal;
      a first lead step coupled to the first lead terminal and residing on a first plane;
      a first lead offset coupled to the first lead step;
      a second lead step coupled to the first lead offset and residing on a second plane that is above the first plane;
      a second lead offset coupled to the second lead step; and
      a third lead step coupled to the second lead offset and residing on a third plane that is below the second plane; and
   the first lead step side where the first active side is connected with the first conductive bump is a top side of the second lead step.

10. The semiconductor device of claim 9, wherein:
    the leads include a second lead;
    the second lead comprises:
       a second lead terminal;
       a fourth lead step coupled to the second lead terminal and residing on the first plane;
       a third lead offset coupled to the fourth lead step;
       a fifth lead step coupled to the third lead offset and residing on the second plane;
       a fourth lead offset coupled to the fifth lead step; and
       a sixth lead step coupled to the fourth lead offset and residing on the third plane; and
    the second lead step side where the second active side is connected with the second conductive bump is a top side of the sixth lead step.

11. The semiconductor device of claim 1, wherein:
    the substrate comprises a paddle having a paddle top side, a paddle bottom side opposite to the paddle top side, and a paddle extension with an extension terminal;
    the first electronic component is coupled to the paddle top side;
    the second electronic component is coupled to the paddle bottom side; and
    the extension terminal is exposed from the first side of the encapsulant.

12. A semiconductor device, comprising:
    a substrate comprising a first lead and a second lead, wherein:
       the first lead comprises:

a first lead terminal comprising a first outer side, a first inner side opposite to the first outer side, and a first lower side connecting the first outer side to the first inner side;
a first lead step coupled to the first lead terminal and residing on a first plane;
a first lead offset coupled to the first lead step;
a second lead step coupled to the first lead offset and residing on a second plane that is different than the first plane;
a second lead offset coupled to the second lead step; and
a third lead step coupled to the second lead offset and residing on a third plane that is different than the second plane;
the second lead comprises:
a second lead terminal comprising a second outer side, a second inner side opposite to the second outer side, and a second lower side connecting the second outer side to the second inner side;
a fourth lead step coupled to the second lead terminal and residing on a fourth plane;
a third lead offset coupled to the fourth lead step;
a fifth lead step coupled to the third lead offset and residing on a fifth plane that is different than the fourth plane;
a fourth lead offset coupled to the fifth lead step; and
a sixth lead step coupled to the fourth lead offset and residing on a sixth plane that is different than the fifth plane;
a first electronic component coupled to the first lead;
a second electronic component coupled to the second lead; and
an encapsulant encapsulating the first electronic component, the second electronic component, and portions of the substrate, wherein:
the encapsulant comprises an encapsulant first side, an encapsulant second side opposite to the encapsulant first side, and an encapsulant lateral side connecting the encapsulant first side to the encapsulant second side; and
the first lower side of the first lead terminal and the second lower side of the second lead terminal are exposed from and coplanar with the encapsulant first side.

13. The semiconductor device of claim 12, further comprising:
a first conductive bump; and
a second conductive bump;
wherein:
the third plane is below the second plane;
the sixth plane is below the fifth plane;
the first electronic component is connected to a top side of the second lead step with the first conductive bump; and
the second electronic component is connected to a top side of the sixth lead step with the second conductive bump.

14. The semiconductor device of claim 12, further comprising:
a first conductive bump; and
a second conductive bump;
wherein:
the third plane is above the second plane;
the sixth plane is above the fifth plane;
the first electronic component is connected to a top side of the third lead step with the first conductive bump; and
the second electronic component is connected to a bottom side of one of the fifth lead step or the sixth lead step with the second conductive bump.

15. The semiconductor device of claim 12, wherein:
the first outer side of the first lead terminal and the second outer side of the second lead terminal are exposed from and coplanar with the encapsulant lateral side; and
the encapsulant encapsulates the first inner side of the first lead terminal and the second inner side of the second lead terminal.

16. A method of manufacturing a semiconductor device, comprising:
providing a substrate comprising leads, the leads comprising:
lead terminals each comprising an outer side, an inner side opposite to the outer side, and a lower side connecting the outer side to the inner side;
lead steps; and
lead offsets extending between the lead steps so that at least some lead steps reside on different planes;
coupling a first electronic component to a first lead step side, the first electronic component comprising:
a first electronic component first side; and
a first electronic component second side opposite to the first electronic component first side;
coupling a second electronic component to a second lead step side, the second electronic component comprising:
a second electronic component first side; and
a second electronic component second side opposite to the second electronic component first side; and
providing an encapsulant encapsulating the first electronic component, the second electronic component, and portions of the substrate,
wherein:
the encapsulant comprises a first side;
the lower sides of the lead terminals are exposed from and coplanar with the first side of the encapsulant; and
the encapsulant encapsulates the inner sides of the lead terminals.

17. The method of claim 16, wherein:
providing the substrate comprises providing a paddle having a paddle top side, a paddle bottom side opposite to the paddle top side, and a paddle extension with an extension terminal;
coupling the first electronic component comprises coupling the first electronic component to the paddle top side; and
coupling the second electronic component comprises coupling the second electronic component to the paddle bottom side.

18. The method of claim 17, wherein:
providing the encapsulant comprises encapsulating the paddle and exposing the extension terminal from the first side of the encapsulant and exposing one or more of the first electronic component first side or the second electronic component second side from the encapsulant.

19. The method of claim 16, further comprising:
coupling a third electronic component to a third lead step side, wherein:
providing the encapsulant comprises encapsulating the third electronic component.

20. A semiconductor device, comprising:
a substrate comprising leads, the leads comprising:
lead terminals;
lead steps; and lead offsets extending between the lead steps so that at least some lead steps reside on different planes;
a first electronic component coupled to a first lead step side, the first electronic component comprising:
a first electronic component first side comprising a first active side; and
a first electronic component second side opposite to the first electronic component first side;
a second electronic component coupled to a second lead step side, the second electronic component comprising:
a second electronic component first side comprising a second active side; and
a second electronic component second side opposite to the second electronic component first side;
conductive bumps comprising a first conductive bump and a second conductive bump;
a third electronic component coupled to a third lead step side and interposed between the first electronic component and the second electronic component; and
an encapsulant encapsulating the first electronic component, the second electronic component, the first conductive bump, the second conductive bump, the third electronic component, and portions of the substrate,
wherein:
the first active side faces and is connected to the first lead step side with the first conductive bump;
the second active side faces and is connected to the second lead step side with the second conductive bump; and
the lead terminals are exposed from a first side of the encapsulant.

21. The semiconductor device of claim 20, wherein:
the first electronic component second side is exposed from a second side of the encapsulant; and
the second side of the encapsulant is different than the first side of the encapsulant.

22. The semiconductor device of claim 20, wherein:
the lead terminals downwardly extend from bottom sides of outermost lead steps;
the lead terminals each comprise:
an outer edge exposed from and coplanar with a third side of the encapsulant;
an inner edge opposite to the outer edge; and
a lower side;
the encapsulant encapsulates each of the inner edges; and
the lower side of each lead terminal is exposed from and coplanar with the first side of the encapsulant.

23. A semiconductor device, comprising:
a substrate comprising leads, the leads comprising:
lead terminals;
lead steps; and
lead offsets extending between the lead steps so that at least some lead steps reside on different planes;
a first electronic component coupled to a first lead step side, the first electronic component comprising:
a first electronic component first side comprising a first active side; and
a first electronic component second side opposite to the first electronic component first side;
a second electronic component coupled to a second lead step side, the second electronic component comprising:
a second electronic component first side comprising a second active side; and
a second electronic component second side opposite to the second electronic component first side;
conductive bumps comprising a first conductive bump and a second conductive bump; and
an encapsulant encapsulating the first electronic component, the second electronic component, the first conductive bump, the second conductive bump, and portions of the substrate,
wherein:
the first active side faces and is connected to the first lead step side with the first conductive bump;
the second active side faces and is connected to the second lead step side with the second conductive bump;
the lead terminals are exposed from a first side of the encapsulant;
the lead terminals downwardly extend from bottom sides of outermost lead steps;
the lead terminals each comprise:
an outer edge exposed from and coplanar with a third side of the encapsulant;
an inner edge opposite to the outer edge; and
a lower side;
the encapsulant encapsulates each of the inner edges; and
the lower side of each lead terminal is exposed from and coplanar with the first side of the encapsulant.

24. The semiconductor device of claim 23, wherein:
the first electronic component second side is exposed from a second side of the encapsulant; and
the second side of the encapsulant is different than the first side of the encapsulant.

25. A semiconductor device, comprising:
a substrate comprising leads, the leads comprising:
lead terminals;
lead steps; and
lead offsets extending between the lead steps so that at least some lead steps reside on different planes;
a first electronic component coupled to a first lead step side, the first electronic component comprising:
a first electronic component first side comprising a first active side; and
a first electronic component second side opposite to the first electronic component first side;
a second electronic component coupled to a second lead step side, the second electronic component comprising:
a second electronic component first side comprising a second active side; and
a second electronic component second side opposite to the second electronic component first side;
conductive bumps comprising a first conductive bump and a second conductive bump; and
an encapsulant encapsulating the first electronic component, the second electronic component, the first conductive bump, the second conductive bump, and portions of the substrate,
wherein:
the first active side faces and is connected to the first lead step side with the first conductive bump;
the second active side faces and is connected to the second lead step side with the second conductive bump;
the lead terminals are exposed from a first side of the encapsulant;
the substrate comprises a paddle having a paddle top side, a paddle bottom side opposite to the paddle top side, and a paddle extension with an extension terminal;

the first electronic component is coupled to the paddle top side;
the second electronic component is coupled to the paddle bottom side; and
the extension terminal is exposed from the first side of the encapsulant.

26. The semiconductor device of claim 25, wherein:
the first electronic component second side is exposed from a second side of the encapsulant; and
the second side of the encapsulant is different than the first side of the encapsulant.

27. The semiconductor device of claim 25, wherein:
the lead terminals downwardly extend from bottom sides of outermost lead steps;
the lead terminals each comprise:
an outer edge exposed from and coplanar with a third side of the encapsulant;
an inner edge opposite to the outer edge; and
a lower side;
the encapsulant encapsulates each of the inner edges; and
the lower side of each lead terminal is exposed from and coplanar with the first side of the encapsulant.

* * * * *